United States Patent [19]
Srinivasagopalan et al.

[11] Patent Number: 4,761,784
[45] Date of Patent: Aug. 2, 1988

[54] MODEM AND METHOD USING MULTIDIMENSIONAL CODED MODULATION

[75] Inventors: Rangarajan Srinivasagopalan, Coral Springs; James D. Pruett, Fort Lauderdale; Vedavalli G. Krishnan, Miami Lakes; Luis V. Farias, Sunrise, all of Fla.

[73] Assignee: Racal Data Communications Inc., Sunrise, Fla.

[21] Appl. No.: 4,389

[22] Filed: Jan. 15, 1987

[51] Int. Cl.[4] ............................................. G06F 11/10
[52] U.S. Cl. ...................................... 371/43; 332/9 R
[58] Field of Search ..................................... 371/43–46, 371/30, 22; 375/38, 39, 42, 58, 34, 25, 27, 67; 332/9 R, 10

[56] References Cited

U.S. PATENT DOCUMENTS

| | | |
|---|---|---|
| 4,077,021 | 2/1978 | Csajka et al. |
| 4,457,004 | 6/1984 | Gersho ........................ 375/39 X |
| 4,581,601 | 4/1986 | Calderbank et al. |
| 4,597,090 | 6/1986 | Forney ............................ 375/39 |
| 4,700,349 | 10/1987 | Gallager ...................... 371/43 X |
| 4,709,377 | 11/1987 | Martinez ...................... 371/43 X |

FOREIGN PATENT DOCUMENTS 85300803.5 11/1985 European Pat. Off.
86303165.4 10/1986 European Pat. Off.

OTHER PUBLICATIONS

Forney, David G. et al., "Efficient Modulation for Band Limited Channels", IEEE Journal on Selected Areas in Communication, vol. SAC, Sep. 2, 1984, pp. 632–645.

Primary Examiner—Jerry Smith
Assistant Examiner—Robert W. Beausoliel
Attorney, Agent, or Firm—William A. Newton

[57] ABSTRACT

Disclosed is a modem including a transmitter having a convolutional encoder for transforming each group interval digital data into an expanded bit sequence having symbol-selecting bits and a frame of subset-selecting bits forming a plurality of bit groups, with each bit group designating a 2-dimensional subset and the symbol-selecting bits being used to select one 2-dimensional symbol from each of the selected subsets, the transmitter further providing modulation of a carrier signal, and a receiver wherein a commonality-seeking, branch cost calculator determines the candidate branch associated with the minimum cost N-dimensional symbol subset for each coset and a Viterbi decoder which determines the maximum likelihood path from a plurality of surviving paths formed from branches selected from the candidate branches.

53 Claims, 12 Drawing Sheets

FIG. 2A

MODEM AND METHOD USING MULTIDIMENSIONAL CODED MODULATION

BACKGROUND

1. Field of the Invention

The present invention relates to transmitting digital data over a band limited channel by using convolutional coding and multidimensional coded modulation.

2. Background of the Invention

U.S. Pat. No. 4,077,021 to Csajka et al. used 2-dimensional coding to improve the performance of the modem against Gaussian noise. In this scheme the signal constellation was partitioned into 2-dimensional subsets. The minimum distance between the points in each subset was chosen to be larger than the minimum distance in the entire constellation. The indices of the subsets were found to be in one to one correspondence with the outputs of certain convolutional encoders. The input bits to the convolutional encoder were divided into two groups. During each baud (symbol interval), the first group of bits was expanded by the convolutional encoder to create subset selecting bits (coded bits) and the second group of bits, i.e., symbol-selecting bits (uncoded bits) was used to select a member of the subset to be transmitted. Although this coding scheme improved the performance of the system against noise, it also doubled the number of points in the signal constellation making the system more susceptible to other impairments. This is mitigated by the use of a multidimensional code, as described in European Pat. application No. 85300803.5 to Gallager and U.S. Pat. No. 4,581,601.

The multidimensional encoder is usually a (m, m−1) convolutional encoder (i.e., the encoder produces m output bits for m−1 input bits) and when m is even, then m=2n, where n=2, 3, or 4 for 4, 6 or 8 dimensional coded modulation, respectively. Thus, a portion of the encoder output typically comprises a frame of n pairs of subset-selecting bits (i.e., bit pairs), with one of the bit pairs being indexed to a subset of signal points (symbols) of the constellation for each of n bauds. The symbol-selecting bits are used to designate one symbol from each subset of signals (symbols), as with the 2-dimensional convolutional coding. Thus, the encoding process thereby creates within a group interval n 2-dimensional symbols. The symbols within a group interval can be viewed as defining a 2n-dimensional point (symbol) from an available alphabet of 2n-dimensional symbols in 2n-dimensional space.

In a modem using multidimensional coded modulation, to obtain fractional bits per baud, the signal constellation can be divided into inner points and outer points, with one of the uncoded bits indicating for the n 2-dimensional (symbols) whether there are any outer points and at least one uncoded bit to indicate in which of the n bauds the outer point occurs, as shown in the article entitled "Efficient Modulation for Band Limited Channels", G. David Forney et al., IEEE Journal On Selected Areas in Communication, Vol. SAC, 2 September, 1984, pp. 632–645. During each frame the encoder output can be considered as a n point sequence. This n point sequence which will hereafter be referred to as a branch and has two attributes. It can be considered as a sequence of subsets of the constellation, and it can also be considered as a sequence of inner and outer points. In order to minimize the average power output of the modem transmitter and hence to improve the performance of the modem in the presence of noise, it is necessary to send the inner points more often. Thus, usually the allowable sequence of inner and outer points of the encoder form a subset of all possible sequences of inner and outer points. We refer to this subset as subset of sequences as opposed to the subset of signal set.

European patent application No. 86303165.4 teaches, for a multidimensional coded modulation system, a method wherein the most likely sequence of multidimensional signal points to have been sent is determined from the received signal. In this method, the distance is computed between each received constituent signal (with dimensions fewer than that of the multidimensional constellation) and the nearest constituent signal points in the corresponding constituent subsets. The distance between each received multidimensional signal and the nearest multidimensional signal point in each multidimensional subset is determined based on a combination of distances with respect to constituent subsets corresponding to the multidimensional subset. The most likely sequence is determined based on the distances between each received multidimensional signal and the nearest multidimensional signal point in each multidimensional subset.

European patent application No. 86303165.4, on page 20, second column, first paragraph suggest that an improper number of outer points can be determined from the detected bits and that "Then a modification is made on those four groups to render them together valid". However, no method of accomplishing this "modification" is taught.

The present inventors started with the assumption that, for each branch, the decoder must select from among the allowable sequences of inner and outer points, the sequence which is closest in distance to the received sequence. Next, the present inventors considered a brute force approach, which is to compute for each branch the closest sequence of inner and outer points by finding the distance of the received sequence from each of the possible sequences of inner and outer points and comparing these distances to find the sequence of inner and outer points with the least distance. For example, if we have a total of m branches of length n (n baud duration) and k (allowable) sequences of inner and outer points (again of length n), then the brute force approach involves for each branch the following:

1. Compute the distance between the received sequence and an allowable sequence of inner and outer points for that branch.
2. Repeat 1 for every allowable sequence of inner and outer points for the same branch.
3. Compare all the distances and decide which particular allowable sequence of inner and outer points is closest to the received sequence for that branch.

Computations yield for each branch the sequence of inner and outer points nearest to the received sequence, along with the corresponding distance. This branch distance will be referred to as branch metric or branch cost. The m branches can be divided into p subsets (hereafter referred to as cosets) with q members each. The constants with m, p and q are related by the equation:

$$m = pq$$

The q branches in each coset form parallel branches of the trellis. To compute the cost associated with each transition of the trellis, it is sufficient to use that branch of the coset which has the least cost within that coset. This requires $p(q-1)$ comparisons of costs to come up with p branch costs so the total number of computations needed are:

1. mk distance (cost) computations, and
2. $m(k-1)+p(q-1)$ distance (cost) comparisons.

In a typical case m is 256, n is 4, k is 5, p is 16 and q is 16. In this case, a total of 1,280 cost computations are needed and 1,264 cost comparisons. The computations can be done with a signal processor (DSP), such as TMS32020. In calculating the number of computations, it has been assumed that for each baud, the square of the distance between the received point and the closet inner point (or any other variable proportional to the square of the distance) has already been computed for each subset. Similarly the square of the distance between the received point and the closest outer point is assumed to have been computed for each baud and each subset. The sequence distance computations can then be done using only additions. For the case of m=256, n=4, k=5, p=16 and q=16, a total of 3,840 additions and 1,264 comparisons have to be made. If this algorithm were to be implemented using commerically available digital signal processors (DSP), such as TMS32025, then most ADD operation requires three instructions:

(i) load accumulator (one instruction),
(ii) ADD accumulator contents to contents of a register (one instruction), and
(iii) store accumulator contents in data memory (one instruction).

The above operation requires three instructions. The compare operation requires:

(i) store accumulator (one instruction),
(ii) subtract accumulator contents from data memory (one instruction), and
(iii) branch to a certain location if accumulator contents are less than zero (two instructions). Under these conditions the accumulator contents are smaller than the register contents and hence, has to be moved to data memory for further comparison. This in turn requires another instruction so that comparison operation requires at least five instruction cycles. With overhead operations, this algorithm requires maximum of 17776 instruction cycles. Since n=4, this means there are four bauds per frame and hence, the instruction cycles per baud is 4444. Assuming the instruction cycle time is a maximum of 100 nano-seconds, the total time for 4444 instructions is 0.44 milliseconds. If the baud rate is 2,742 Hz, then to perform the algorithm, 1.2 DSPS would be needed making it difficult to implement this algorithm in practice.

SUMMARY OF THE INVENTION

A first aspect of the present invention is directed to a method and apparatus having a properly selected convolutional encoder that allows for a branch cost calculator wherein the computational complexity of the branch cost calculations, as described in the Background section, are reduced considerably so that they can be implemented with the least number of instructions. In particular, this aspect of the present invention makes it unnecessary to determine the branch metric (cost) for each member of a coset and to directly compare all of the branch metrics during each group interval.

A convolutional encoder is designed to provide at least one group of at least two of the members of one of the cosets with each of the members of the group having a non-common portion and a common portion. Each of the non-common portions includes at least one non-common component which is different between the at least two members and each of said common portions includes at least one common component which is the same between the at least two members. A branch cost calculator compares at least two non-common portion costs associated with the non-common portions and selects a surviving said non-common portion with a minimum non-common portion cost, whereby the selection of the surviving non-common portion based upon the minimum non-common portion cost determines which of the at least two members has the minimum member costs. Additionally, the present invention makes use of the fact that the encoder provides at least one other group with the same non-common portions and that once the comparison is made and the cost determined for one group, such a determined cost can be used in the other group having the same non-common portions. The utilization of the commonality of components between members combined with the repetition of the non-common portions of one of the groups in at least one other group, first, reduces the computations required to eliminate members within a coset and, second, allows for costs calculated for one group to be used in at least one other group.

In the specific embodiments of the present invention shown herein, there are sixteen cosets provided by the encoder with each coset being arranged to have four subcosets having the following characteristics. Each subcost has two of the groups of members, with each group of members being a pair of the members. The non-common portions of each group define a set, which is repeated in eight other groups. Consequently, the determination of the surviving non-common portion of each set reduces the number of surviving members of all cosets to one-half. Additionally, each subcoset has a group of submembers which includes the non-common portions of both of its pairs of members. Each of the group of submembers is repeated in four cosets of one of four supercosets which means that once the minimum cost submember of each subcoset is determined, this cost can be used for four subcosets.

In a second aspect of the present invention, it has been discovered that the comparisons of each branch for the allowable sequence of inner and outer points can be done after the Viterbi decoder, albeit, suboptimally without adverse effects, which in turn reduces the complexity of the calculations required in the branch cost calculator. This reduces the complexity of computations considerably with very little degradation of performance.

BRIEF DESCRIPTION OF THE DRAWINGS

Further objects and advantages of the present invention will become apparent as the following description proceeds, taken in conjunction with the accompanying drawings in which:

FIG. 2A shows the upper two quadrants of the complex plane of the signal constellation used with the present invention.

DETAILED DESCRIPTION OF PREFERRED EMBODIMENT

Figure 1:
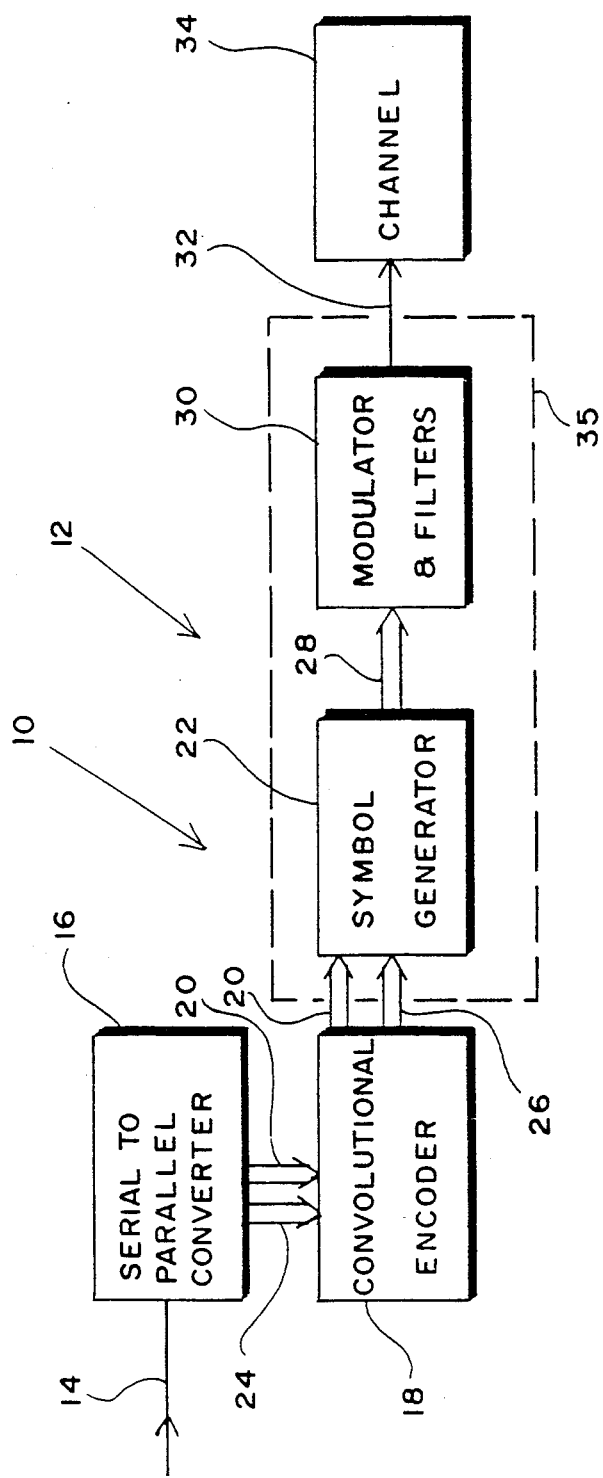
FIG. 1 shows a block diagram of a transmitter of a modem of the present invention and the channel.

Referring to FIG. 1, there is shown a block diagram of the generalized structure of a transmitter 10 of a modem 12 in which the present invention is implemented. In the transmitter 10 an information bit stream 14 is made up of serial digital data from a data source (not shown). From the information bit stream 14, bit sequences of fixed length are taken by a serial to parallel converter 16 to form packets of bits which are passed on to a convolutional encoder 18. A portion of the bits of each packet, symbol-selecting bits 20, are passed through the convolutional encoder 18 to a symbol generator 22. The remaining portion 24 of the bits of the packet are passed on to the convolutional encoder 18. The convolutional encoder 18 preferably, but not necessarily, is an encoder which allows for 2n dimensional coded modulation. In the preferred embodiment, for each packet, a portion of the output of the convolutional encoder 18, i.e., subset-selecting bits 26, form a frame of an even number of bits, i.e, the subset-selection bits in a frame consist of 2n bits. In other implementations, the frame can have an odd number of bits. The subset-selecting bits 26 are passed to the symbol generator 22. For each received packet, the subset-selecting bits 26 and symbol-sselecting bits 20 form an output of the encoder 18 that will be identified as the expanded bit sequence. The symbol generator 22 typically uses a pair (i.e., bit group) of the 2n subset-selecting bits each baud (i.e., symbol interval/modulation period) to specify one of four subsets into which a symbol constellation is partitioned. The symbol-selecting bits 20 are used by the symbol generator 22 to select a symbol (i.e., signal point in constellation) from each subset. Consequently, each packet from the converter 16 is mapped onto a group of n 2-dimensional symbols in n bauds (one group inter-val), where n is $>1$ and defines a multidimensional point (symbol) 28. The multidimensional symbols 28, in a conventional manner, are filtered by bandwidth limiting filters and used to modulate a carrier in modulator and filter means 30 to provide a modulated carrier signal 32 to a band limited channel 34. The symbol generator 22 and modulator and filtering means 30 define a multidimensional coded modulation means 35.

Figure 2A:
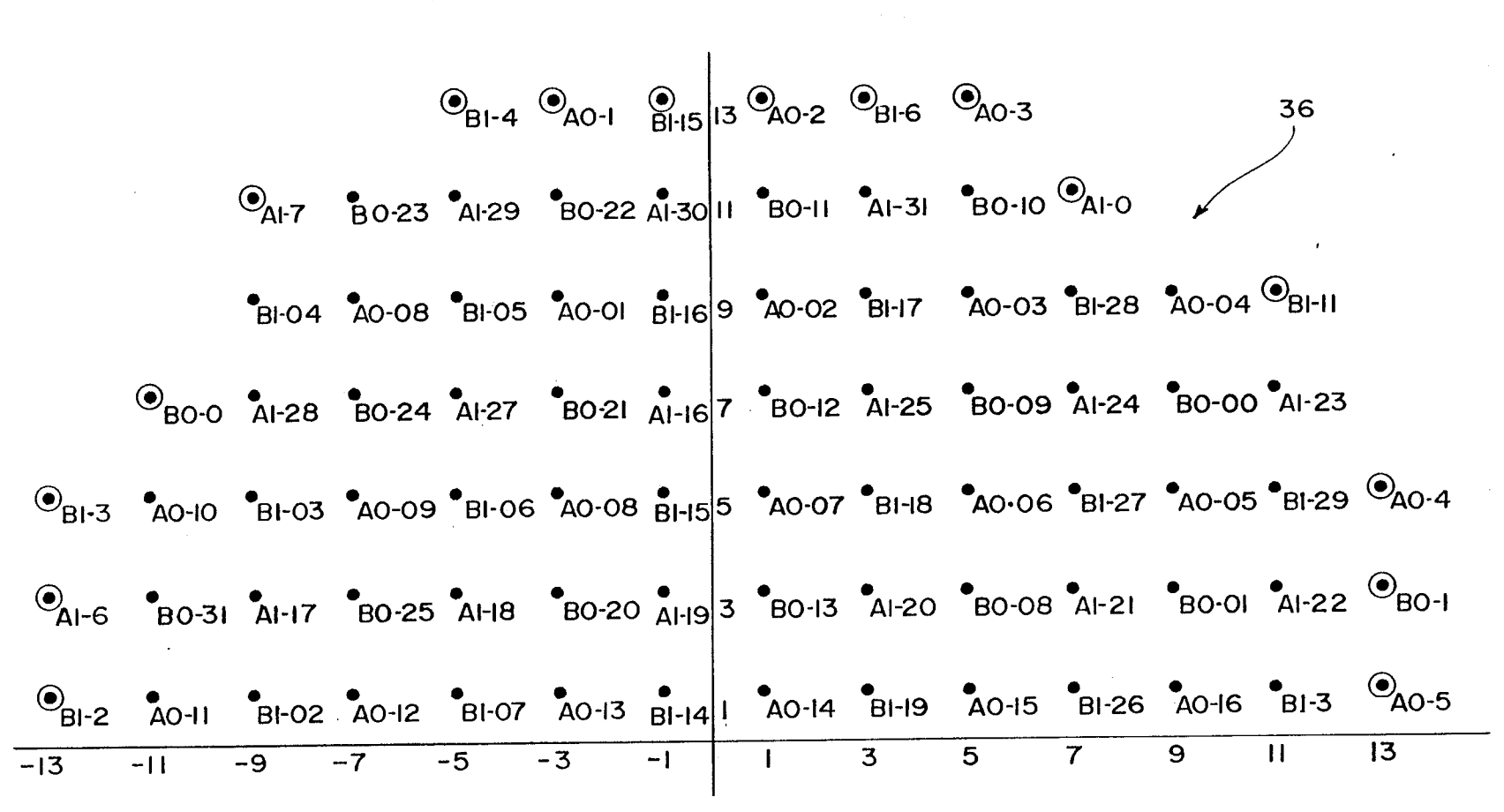
Figure 2B:
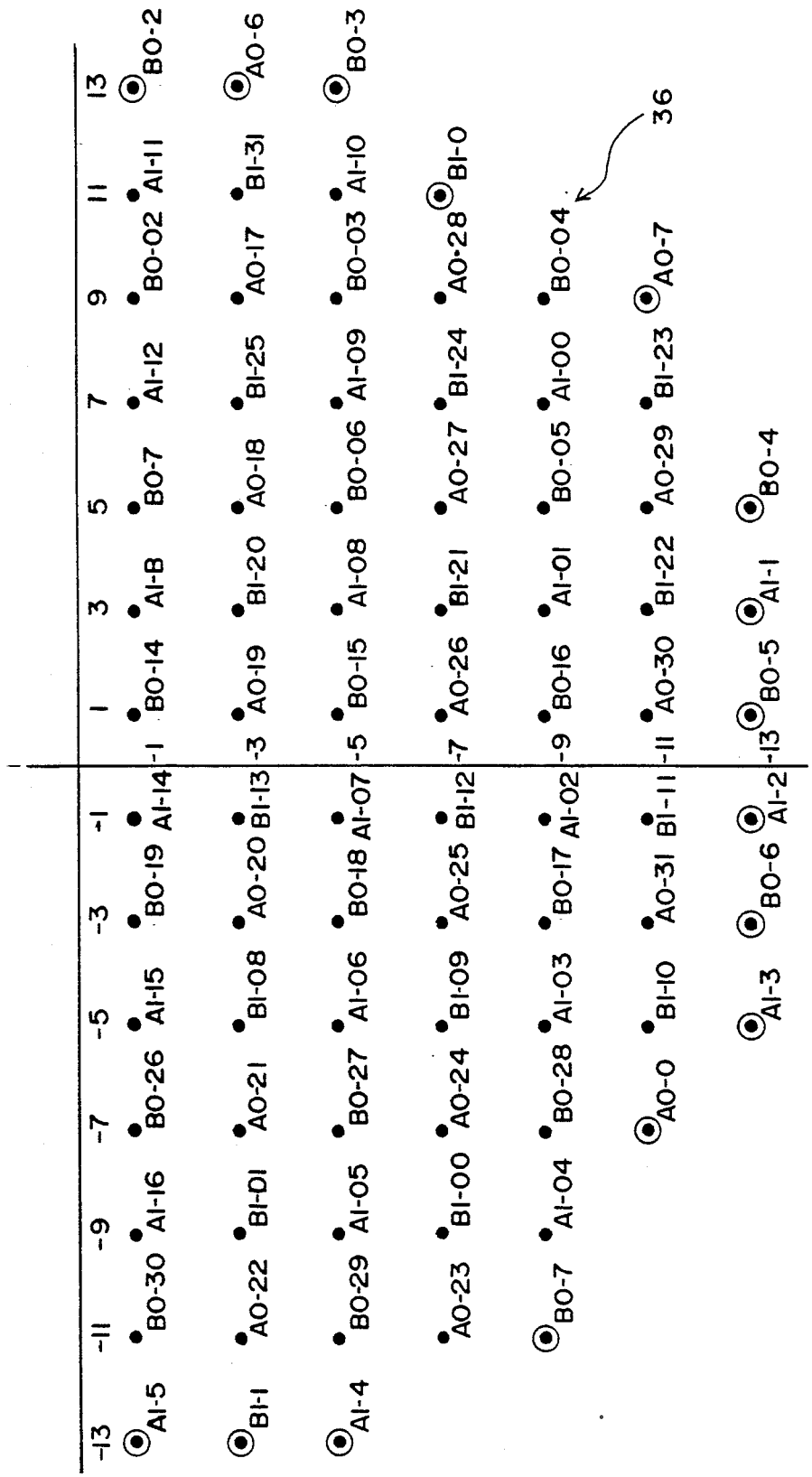
FIG. 2B shows the lower two quadrants of the complex plane of the signal constellation of the present invention.

The specific structure of the transmitter 10 will now be described. The modem 12 in which the present invention is preferably, but not necessarily, implemented transmits data at a rate of 19,200 bits per second. The symbol constellation 36 used by the symbol generator 22 of FIG. 1 is shown in FIGS. 2A and 2B, with upper two quadrants and lower two quadrants of the complex plane of the constellation 36 being shown, respectively, in FIGS. 2A and 2B. For purposes of illustration, the transmitter 10 uses eight dimensional coded modulation. The baud rate is 2742.86 symbols per second with 7 bits per baud. The constellation 36 has 160 complex 2-dimensional symbols, i.e., signal points, with each symbol having a specific alphanumerical identifier. The symbols are divided into outer and inner points, with a circle around each signal point that is an outside point. The symbol constellation 36 also is divided into four subsets A0, A1, B0, B1, which are the first portion of the symbol identifier. After the subset identifier, separately for both inner or outer symbol groups, the symbols within each subset are designated in the symbol identifier by the number after the hyphen. For example, the symbol identifier "A0-5" for a circled point indicates an outer point from the subset A0, with that particular point being designated by number 5 within the outer points of the subset A0. In summary, the constellation is not only partitioned into four subsets of A0, A1, B0, and B1, but the constellation is also divided into a portion having inner points and a portion having outer points. Although the preferred embodiment has four subsets, different numbers and arrangements of subsets are possible.

Each subset is represented by a two bit number shown in Table 1.

TABLE 1

| Subset | Subset Index | |
|--------|-----|-----|
|        | MSB | LSB |
| A0     | 0   | 0   |
| B1     | 0   | 1   |
| B0     | 1   | 0   |
| A1     | 1   | 1   |

Thus, the subset-selecting bits 26 of FIG. 1 form an output of the (m, m−1) convolutional encoder 18 of FIG. 1 which can be represented by n 2-dimensional subsets of the form shown in Table 1. The integer m is equal to 2n plus the number of symbol selecting bits. MSB and LSB stand for most significant bit and least significant bit, respectively.

Figure 3:
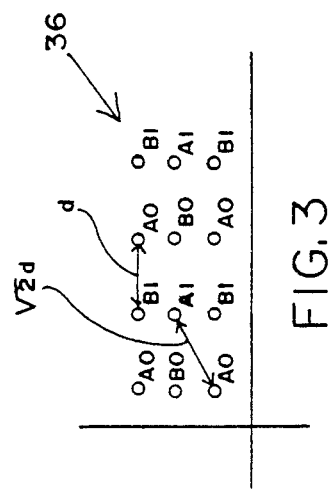
FIG. 3 shows a fragmented portion of the upper, right hand quadrant of the signal constellation and illustrates the distance properties in the constellation.

To better illustrate the subset to symbol mapping provided by the symbol generator 22, a portion of the first quadrant of the symbol constellation 36 shown in FIG. 2A is enlarged and shown in FIG. 3. The symbols of the constellation 36 are on a square grid of the complex plane. From FIG. 3 it can be seen that the maximum Euclidean distance of $2^{\frac{1}{2}}(d)$ occurs between A0 and A1 as well as between B0 and B1. The minimum distance of d is between A0 and B0, A0 and B1, A1 and B0 and A1 and B1. The maximum Hamming distance also occurs between A0 and A1, as well as between B0 and B1.

Figure 5:
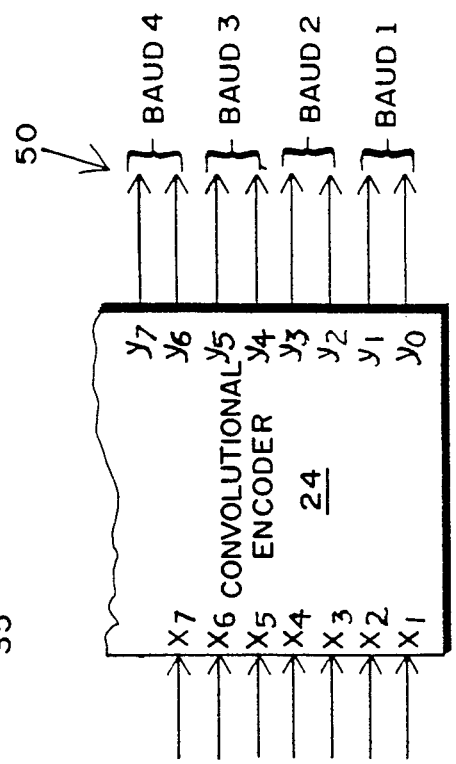
FIG. 5 is a schematic diagram of a portion of the convolutional encoder which generates the subset-selecting bits.
Figures 4, 6, 7:
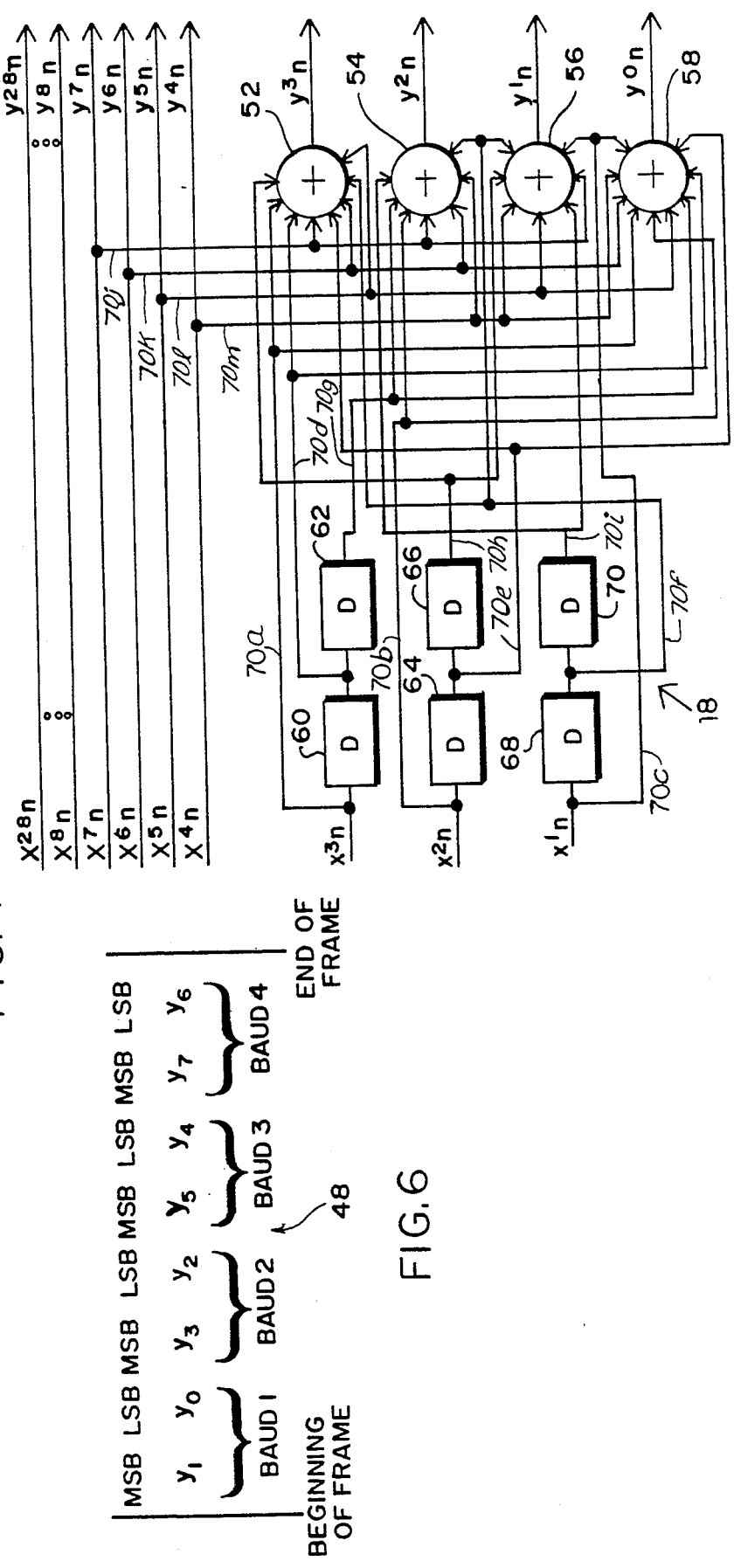
FIG. 4 shows a data packet utilized in the present invention.
FIG. 6 shows a frame of the subset-selecting bits generated by the convolutional encoder.
FIG. 7 shows the structure of the convolutional encoder.

FIG. 4 shows a packet of data generated by the serial to parallel converter 16 of FIG. 1 which comprises 28 bits which go to the convolutional encoder 18. The bits $x_8$-$x_{28}$ are the symbol-selecting bits 20. As shown in FIG. 5, bits $x_1$, $x_2$, $x_3$, $x_4$, $x_5$, $x_6$, and $x_7$ form the input bits 24 to convolutional encoder 18 of FIG. 1. As shown in FIGS. 5 and 6, the output bits $y_7$, $y_6$, $y_5$, $y_4$, $y_3$, $y_2$, $y_1$, and $y_0$ of the encoder 18 are grouped into four bit groups ($y_7y_6$), ($y_5y_4$), ($y_3y_2$) and ($y_1y_0$) that defines a frame 48 of bits of FIG. 6. As will be explained hereinafter, bits $x_1$-$x_7$ form only a portion of the expanded bit sequence output of the encoder 18 of FIG. 1. FIGS. 5 and 6 shows the assignment of bit groups for each baud in the frame 48, with each bit group 50 defining a bit pair in the preferred embodiment. Each frame 48 has the duration of a group interval (time interval) that is four bauds in duration. Via Table 1, each bit group 50 of FIG. 5 corresponds to one of the four 2-dimensional subsets A0, A1, B0 and B1. A symbol is transmitted from one of the 2-dimensional subsets in each of the four bauds. When viewed on a multidimensional level, each frame 48 of FIG. 6 of eight bit output of the encoder 18 of FIG. 1 corresponds to one of 256 8-dimensional symbol subsets, with each multidimensional symbol subset corresponding to a different combination of four 2-dimensional symbol subsets. For example, the multidimensional symbol subset A1 B0 A0 B0 (11100010) corresponds to 2-dimensional symbol subsets (11), (10), (00) and (10).

From this point on we will use superscripts to indicate the order of the bits inside the frame and subscripts to refer to the frame number in which the bits occurs. For example, referring to frame 48 in FIG. 6, bit $x_7$ occurring in the nth frame will be referred to as $x_n^7$. Table 2 shows the assignment of points from inner and outer points of the constellation 36 shown in FIGS. 2A-2B for different values of $x_n^8$, $x_n^9$ and $x_n^{10}$. Bit $x_n^8$ indicates whether the frame 48 of FIG. 6 has any outer points or not. If the frame 48 (i.e., one of the bauds of the frame) were to have an outer point, then the dibit $x_n^9 x_n^{10}$ would indicate in which baud (and therefore bit group) the outer point would occur. In Table 2, "Inner" means inner point and "Outer" means outer point.

TABLE 2

| $x_n^8$ | $x_n^9$ | $x_n^{10}$ | baud 1 | baud 2 | baud 3 | baud 4 |
|---|---|---|---|---|---|---|
| 0 | X | X | Inner | Inner | Inner | Inner |
| 1 | 0 | 0 | Outer | Inner | Inner | Inner |
| 1 | 0 | 1 | Inner | Outer | Inner | Inner |
| 1 | 1 | 0 | Inner | Inner | Outer | Inner |
| 1 | 1 | 1 | Inner | Inner | Inner | Outer |

Table 3 shows how the symbol-selecting bits 20 of FIGS. 1 and 4 are assigned with each group of $x_n^8$, $x_n^9$, and $x_n^{10}$.

TABLE 3

| $x_n^8$ | $x_n^9$ | $x_n^{10}$ | baud 1 | baud 2 | baud 3 | baud 4 |
|---|---|---|---|---|---|---|
| 0 | X | X | $x_n^9$-$x_n^{13}$ | $x_n^{14}$-$x_n^{18}$ | $x_n^{19}$-$x_n^{23}$ | $x_n^{24}$-$x_n^{28}$ |
| 1 | 0 | 0 | $x_n^{11}$-$x_n^{13}$ | $x_n^{14}$-$x_n^{18}$ | $x_n^{19}$-$x_n^{23}$ | $x_n^{24}$-$x_n^{28}$ |
| 1 | 0 | 1 | $x_n^{11}$-$x_n^{15}$ | $x_n^{16}$-$x_n^{18}$ | $x_n^{19}$-$x_n^{23}$ | $x_n^{24}$-$x_n^{28}$ |
| 1 | 1 | 0 | $x_n^{11}$-$x_n^{15}$ | $x_n^{16}$-$x_n^{20}$ | $x_n^{21}$-$x_n^{23}$ | $x_n^{24}$-$x_n^{28}$ |
| 1 | 1 | 1 | $x_n^{11}$-$x_n^{15}$ | $x_n^{16}$-$x_n^{20}$ | $x_n^{21}$-$x_n^{25}$ | $x_n^{26}$-$x_n^{28}$ |

FIG. 7 shows the convolutional encoder 18 of FIGS. 1 and 5 in detail. The encoder 18 is a 64 state (8, 7) encoder. As previously described, the input bits to the encoder are $x_n^i$, where i=1 through 28 and the output bits are $y_n^i$, where i=0 through 28. As is well-known, the encoder adds one redundancy bit; however, in the preferred embodiment the encoder adds less than one bit per baud of redundancy into the system. Encoders with redundancies greater than one bit (and therefore redundancy of one or greater per baud) can be used with the present invention. Input bits $x_n^8$ through $x_n^{28}$ are passed through unchanged and unused to become output bits $y_n^8$ though $y_n^{28}$. Inputs $x_n^4$-$x_n^7$ are used but pass through the encoder 18 without being changed and become output bits $y_n^4$-$y_n^7$. The input bits $x_n^1$-$x_n^3$ are expanded to create the output bits $y_n^0$-$y_n^3$. The output bits of $y_n^0$ through $y_n^{28}$ are identified as the expanded bit sequence, which includes the subset-selecting bits $y_n^0$-$y_n^7$ and the symbol-selecting bits $y_n^8$-$y_n^{28}$. The convolutional encoder 18 includes four modulo 2 adders 52, 54, 56, and 58, each connected to receive at least some of the bits $x_n^3$, $x_n^2$, and $x_n^1$. The encoder 18 includes six delay elements 60, 62, 64, 66, 68, and 70, with each element providing a delay of one group interval (four bauds). The input bit $x_n^3$ is fed to the modulo adders 52 and 58 via line 70a, the input bit $x_n^2$ is fed to the modulo adders 54 and 58 via line 70b, and the input bit $x_n^1$ is fed to the modulo adders 56 and 58 via line 70c. With a one group interval delay, the bit $x_{n-1}^3$ is fed to the modulo adders 52 and 58 via line 70d, the bit $x_{n-1}^2$ is fed to the modulo adders 54 and 58 via line 70e, and the bit $x_{n-1}^1$ is fed to the modulo adders 52, 54 and 56 via line 70f. With a two group interval delay, the bit $x_{n-2}^3$ is fed to the modulo adders 54 and 58 via line 70g, the bit $x_{n-2}^2$ is fed to the modulo adders 52 and 56 via line 70h, and the bit $x_{n-2}^1$ is fed to the modulo adders 54 and 56 via line 70i. The bit $x_n^7$ is fed to the modulo adders 52, 54, and 56 via line 70j. The bit $x_n^6$ is fed to the modulo adders 52, 54, and 58 via line 70k. The 4 bit $x_n^5$ is fed to the modulo adders 52, 56, and 58 via line 70l. The bit $x_n^4$ is fed to the modulo adders 54, 56 and 58 via line 70m.

With reference to FIG. 7, the input-output relationships of the subset-selecting bits 26 of the encoder 18 are as follows:

$$y_n^7 = x_n^7 \quad \text{(Equation 1)}$$

$$y_n^6 = x_n^6$$

$$y_n^5 = x_n^5$$

$$y_n^4 = x_n^4$$

$$y_n^3 = x_n^3(1 \oplus D) \oplus x_n^2(D \oplus D^2) \oplus x_n^1 D \oplus x_n^7 \oplus x_n^6 \oplus x_n^5$$

$$y_n^2 = x_n^3 D^2 \oplus x_n^2 \oplus x_n^1(D \oplus D^2) \oplus x_n^7 \oplus x_n^6 \oplus x_n^4$$

$$y_n^1 = x_n^2 D^2 \oplus x_n^1(1 \oplus D \oplus D^2) \oplus x_n^7 \oplus x_n^5 \oplus x_n^4$$

$$y_n^0 = x_n^3(1 \oplus D \oplus D^2) \oplus x_n^2(1 \oplus D) \oplus x_n^1 \oplus x_n^6 \oplus x_n^5 \oplus x_n^4$$

where D is a delay element and + means an exclusive OR operation.

Figure 8:
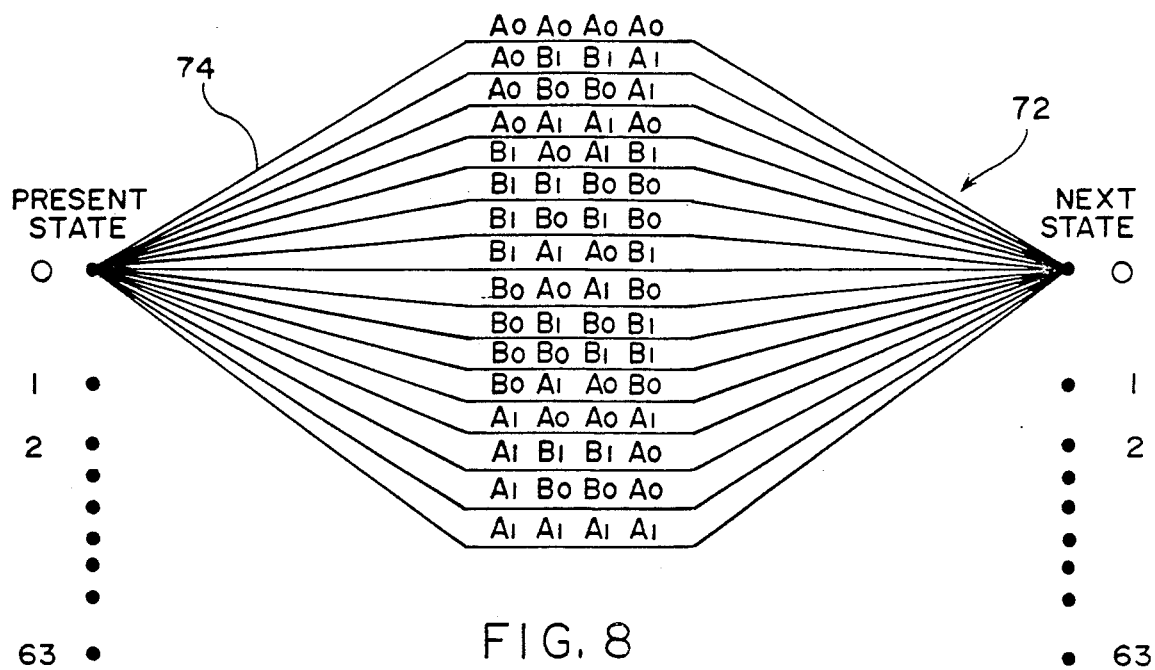
FIG. 8 shows two states of the trellis with the branches shown between the present state zero and the next state zero.

The convolutional encoder 18 of FIG. 1 is a finite state device which passes through a succession of states, with each state being separated in time by one group interval. Referring to the trellis diagrams in FIG. 8, the encoder 18 of FIG. 1 has 64 possible states (not all shown). Due to the fact that the encoder 18 has three binary inputs, for a given present state, only 8 of the next states are permissible, i.e., can be reached from the present state. Which next state occurs is a function of the present state and on the combination of the $x_n^1$, $x_n^2$, and $x_n^3$ bits received each group interval. Each permissible transition from one state to another state is identified by a coset of parallel branches. In general, the trellis can be used to diagram all permissible transitions between the present state to the next state of the encoder, although only the parallel branches 74 between present state 0 and next state 0 are shown in FIG. 8. There are 256 possible branches which exist in the trellis. These 256 branches are subdivided into two groups of 128 branches each.

The branches from a present state to a next state can be either from one or the other group. Extending from the present state 0, 128 branches exist in the trellis 72, with 16 branches (one coset) going to each of 8 permissible next states (only one set of 16 is shown). Likewise, 128 branches can extend from each present state in the same manner and this is extended continuously between adjacent states separated by group intervals. In the preferred embodiment, the group used of the two groups of 128 branches alternates with the states, e.g., state 0 using one group and state 1 using the other group and so on.

From FIG. 7 and the Equations 1 for encoder 18 of FIG. 1, it can be shown that $x_n^7$, $x_n^6$, $x_n^5$ and $x_n^4$ do not affect the states. In other words, changing any one or all of these bits does not change the state. Hence, between any two given states occurring at successive group intervals, there will be the previously described sixteen parallel branches, with each of the sixteen branches having a different multidimensional symbol subset associated with it, as shown in FIG. 8. As previously mentioned, this set of sixteen parallel branches is referred to as a coset. The 256 branches can be decomposed into 16 cosets. Hence, between a present state and each of 8 next permissible states, there will be 16 branches with each branch being labeled by one of the 16 multidimensional symbol subsets of a given coset. With respect to FIG. 8, in the preferred embodiment, 8 of the cosets are assigned to even number states and 8 are assigned to odd number states. For the purposes of illustration, only those multidimensional symbol subsets of the coset associated with the branches going from present state 0 to next state 0 are shown in FIG. 8. The multidimensional symbol subsets associated with each branch can be indexed by integers ranging from 0 to 255. The index can be expressed as:

Index of 8 dimensional subset=64(index of subset for baud 4)+16(index of subset for baud 3)+4(index of subset for baud 2)+index of subset for baud 1.

As to the multidimensional symbol subsets associated with each branch, the 2-dimensional subsets therein preferably, but not necessarily, are arranged as a frame of subsets for bauds 4, 3, 2, 1, in that order. The encoder 18 transmits 29 bits in 4 bauds or 7.25 bits per baud.

Figure 9:
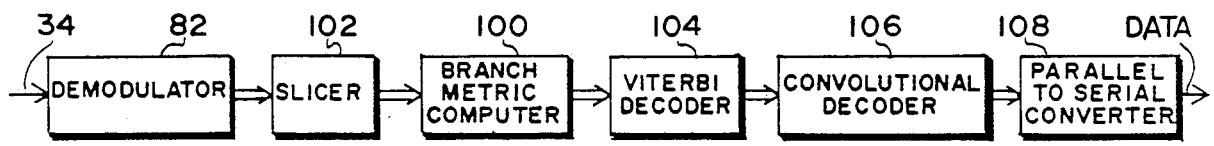
FIG. 9 is a block diagram of the receiver of the present invention.

A receiver 80 of the modem is generally shown in the block diagram of FIG. 9 and includes a demodulator 82. The noise affected modulated carrier signal is received over the channel 34 and in a conventional manner that will not be detailed herein is passed through the demodulator 82 (which is normally preceded by a Hilbert filter and passband equalizer) to produce a baseband signal consisting of a stream of received 2-dimensional symbol signals.

Figure 10:
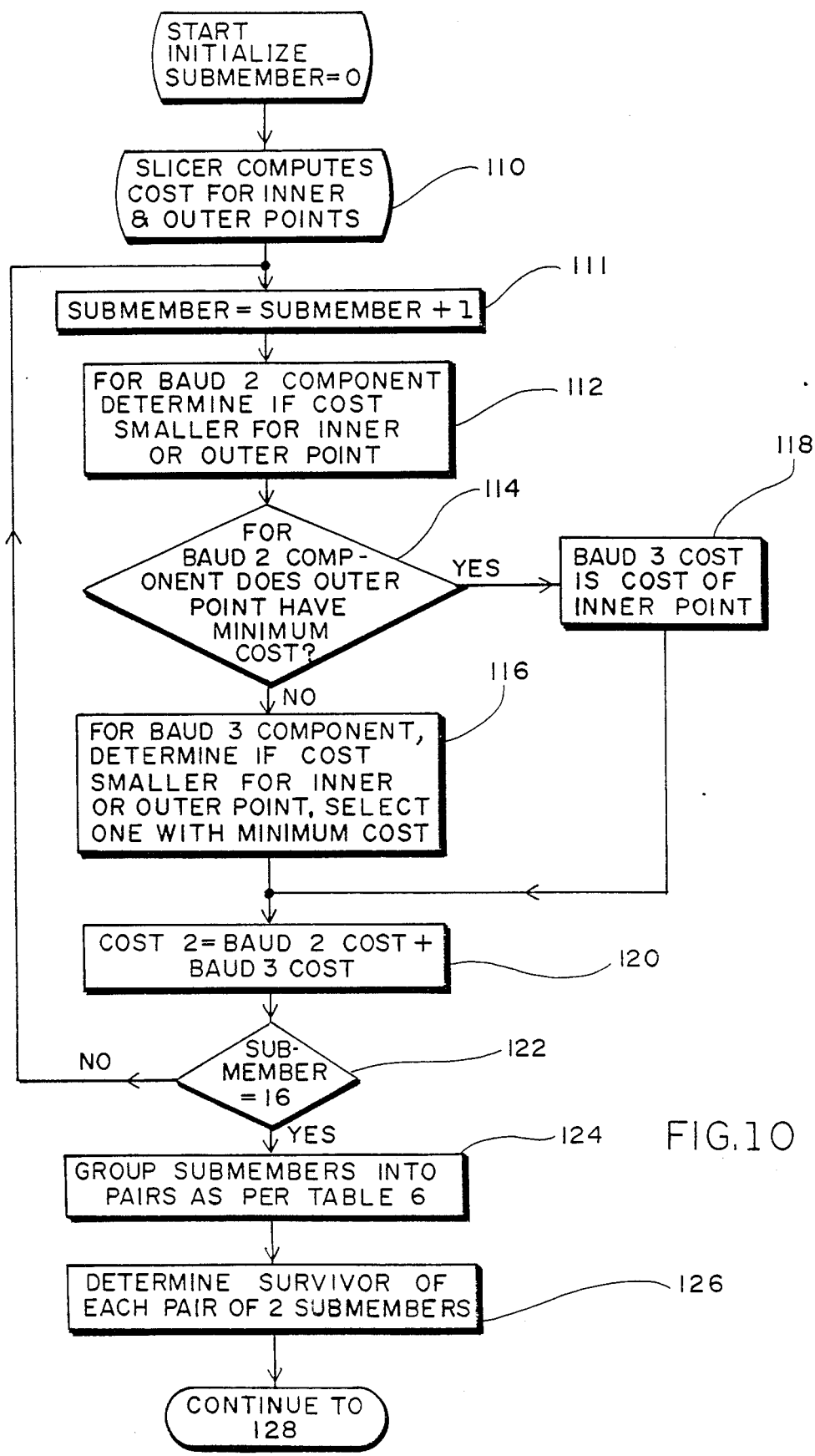
FIG. 10 is a flow chart of the branch metric calculator of the present invention.

The decoding process is repeated for each frame of received subset-defining bits (e.g., bits defining a multidimensional symbol subset), which is the received version of the frame transmitted and shown in FIG. 6. To accomplish this, in the receiver 80 of FIG. 10, the receiver operation is synchronized to the frames of the incoming signal i.e., the receiver must know the beginning of each frame. In other words, the receiver must determine which bit group in the received frame of subset-defining bits corresponds to the bit group ($y_1y_0$) in the transmitted subset-defining bits. Having found this starting bit group, the receiver frame of received subset-defining bits is synchronized with the transmitter frame of subset-defining bits.

Referring to FIG. 9, the operation of slicer 102 will be described. Each received multidimensional signal provides information in the form of the multidimensional subsets of the multidimensional points sent. As previously mentioned, the received 8-dimensionl signal can be decomposed into four 2-dimensional signals which occur consecutively. More specifically, each frame of the received multidimensional signal can be represented as R(1), R(2), R(3), and R(4), where:

$$R(J) = [RX(J), RY(J)], 1 < J < 4 \quad \text{(Equation 2)}$$

In a first embodiment of the branch metric computer 100 of the present invention (to be described hereinafter) the inner and outer points are taken into account in the cost calculations. Consequently a symbol (ideal point) in the signal constellation can be represented as:

$$IDL(K, L, N) = [IDLX(K, L, N), IDLY(K, L, N)] \quad \text{(Equation 3)}$$

where
K=0 means that the point is inner
K=1 means that the point is outer
L=1 means that the point belongs to subset A0
L=2 means that the point belongs to subset B1
L=3 means that the point belongs to subset B0
L=4 means that the point belongs to subset A1 and
N=index of the point in the subset.

In the first embodiment, N can take on values from 0 to 31, if the point belongs to the inner part of the constellation (that part comprised of inner points) and N=0 to 7 for points on the outer part of the constellation (that part comprised of outer points). For each K, L and J, the slicer 102 finds the N=$N_{min}$, such that $$|R(J)-IDL(K, L, N_{min})| < |R(J)-IDL(K, L, N)|$$

where $$|R(J)-IDL(K, L, N)|^2 = |RX(J)-IDLX(K, L, N)|^2 + |RY(J)-IDLY(K, L, N)|^2 \quad \text{(Equation 4)}$$

The slicer 102 thus finds eight nearest points for the received signal of each baud. Of these eight ideal points, four are inner points and four are outer points. A pair of inner and outer points belong to each of the four subset A0, B0, B1 and A1. For each baud of the four baud frames, we can denote the Euclidean distance (metric) between each of the ideal point and the received point as $d[J, K(J), L(J), N_{min}(J)]$. Thus $$d[J, K(J), L(J), N_{min}(J)] = |R(J)-IDL[K(J), L(J), N_{min}(J)]| \quad \text{(Equation 5)}$$

In a second embodiment of the branch metric calculator 100 of the present invention wherein no distinction is made between inner and outer points, the "K" terms are removed from the above equations, and the slider 102 thus finds the four nearest points to the received signal for each baud, regardless of whether the nearest point is an inner point or an outer point. Only the costs (metrics) of the four nearest points to the received signal are needed for the branch metric (cost) calculator 100 of the second embodiment and there is no need for keeping track of the points themselves. However, as will be described hereinafter, for the Viterbi decoder 104 of the second embodiment, it is necessary to calculate Equations 4 and 5 for both inner and outer points (K=0 and 1), but only for the subsets of the estimated multidimensional symbol subset. For each baud there needs to be only one inner and one outer point determined (L has a single value each baud as defined by the estimated multidimensional symbol subset.)

A branch metric (cost) is the distance between a received multidimensional signal and possible multidimensional symbol from the multidimensional symbol subset corresponding to the branch of the trellis. A Viterbi decoder (to be described hereinafter) computes a cumulative path metric for each of the survivor paths during each frame. This cumulative path metric (cost) is the arithmetic sum of the metrics of the individual branches which form the particular path.

The branch metric calculator 100 selects for each coset (group of 16 parallel branches each) that branch, i.e., multidimensional symbol subset, which has the minimum branch metric, which results in reducing the number of contending branches from 256 to 16. As will be discussed hereinafter, only one branch of each coset can be a candidate to be part of one of the surviving paths of the trellis during the decoding process. Thus, the described reduction by a factor of 16 of the contending branches is based upon which branch of said coset represents the multidimensional symbol subset which is closest to the received multidimensional signal.

The present invention concerns the computations performed by the branch cost calculator 100. In a brute force implementation of a branch metric computer, the branch metric calculator 100 would compute the branch metric term, which can be either equal to or proportional to $d_{BRANCH}(I)$ where $d_{BRANCH}(I)$ is defined by:

$$d_{BRANCH}(I) = [d^2(1, K(1), L(1), N_{min(1)}) + d^2(2, K(2), L(2), N_{min(2)}) + d^2(3, K(3), L(3), N_{min(3)}) + d^2(4, K(4), L(4), N_{min(4)})]$$

(Equation 6)

As previously explained, each branch of the trellis corresponds to a possible multidimensional symbol subset (therefore a four baud signal in the frame) and in this embodiment there are 256 branches, as identified by multidimensional symbol subsets A0 A0 A0 A0 through A1 A1 A1 A1. For each multidimensional symbol subset, five possible signal combinations of 2-dimensional symbols can be constructed having inner (In) and outer (Out) points (symbols) as shown in Table 4.

TABLE 4

| In  | In  | In  | Out |
|-----|-----|-----|-----|
| In  | In  | Out | In  |
| In  | Out | In  | In  |
| Out | In  | In  | In  |
| In  | In  | In  | In  |

In Table 4 we assume that the right most signal of the frame belongs to the first baud and the left most signal is that of the fourth baud. In the case where inner and outer points are to be taken into account, the brute force computation of Equation 6 would be done for each of the five combinations shown in Table 4 and the combination with the least value is chosen as the metric for the branch. After this reduction, we have 256, $d^2$ values, one for each of the 256 branches, with each squared distance $d^2$ value representing the squared distances between the received 2-dimensional signal and the contending 2-dimensional symbol subsets. As previously mentioned, the contending branches are next reduced from 256 to 16, based upon selecting the lowest cost branch for each coset.

The present invention is directed toward making it unnecessary to determine the branch metric for each branch and to directly compare all of the branch metrics (cost) during each group interval. As will be discussed in detail, in looking for commonality in certain components, i.e., 2-dimensional symbol subsets, the brute force approach can be avoided. In order to avoid confusion with similar terms, in the following discussion, the term "component" will be used in place of "2-dimensional symbol subset".

As previously described, a branch is associated with a unique multidimensional symbol subset, which is a sequence of components and has n components. Each multidimensional symbol subset of a coset is defined as being a "member" of that coset. A submember of a member consists of part of the components of the member. The submember does not have all of the components of the member and only has components that form some part of the member in the same bauds. If two or more members (or submembers) have the same components for the same bauds, they are said to have common components, if not they are said to have non-common components in those bauds. The present invention makes use of the fact that several members have a common submember and the cost of this common submember (once calculated) can be used for all the members of any coset which has this common submember without having to be calculated repeatedly. With respect to FIG. 8, it is important to note that the parallel branches 74 between states are merely added to conceptually illustrate that when the convolutional encoder passes from one state to another, as shown by the lines connecting the states, one of a plurality of multidimensional symbol subsets have been generated. Of cource, the lines do not physically exist and what in fact exists is only a number representative of the multidimensional symbol subset.

The 256 multidimensional symbol subsets (members) associated with 256 branches of the trellis for the encoder of FIG. 6 are provided in Table 5.

TABLE 5

| SUPERCOSET 1 | | | |
|---|---|---|---|
| Coset 7 | Coset 4 | Coset 9 | Coset 10 |
| A0A0B1A1 | A0A0B1A0 | A0A0B0B1 | A0A0B0B0 |
| A0B1A0A0 | A0B1A0A1 | A0B1A1B0 | A0B1A1B1 |
| A0B0A1A0 | A0B0A1A1 | A0B0A0B0 | A0B0A0B1 |
| A0A1B0A1 | A0A1B0A0 | A0A1B1B1 | A0A1B1B0 |
|  |  |  |  |
| B1A0B0B0 | B1A0B0B1 | B1A0B1A0 | B1A0B1A1 |
| B1B1A1B1 | B1B1A1B0 | B1B1A0A1 | B1B1A0A0 |
| B1B0A0B1 | B1B0A0B0 | B1B0A1A1 | B1B0A1A0 |
| B1A1B1B0 | B1A1B1B1 | B1A1B0A0 | B1A1B0A1 |
|  |  |  |  |
| B0A0B0B1 | B0A0B0B0 | B0A0B1A1 | B0A0B1A0 |
| B0B1A1B0 | B0B1A1B1 | B0B1A0A0 | B0B1A0A1 |
| B0B0A0B0 | B0B0A0B1 | B0B0A1A0 | B0B0A1A1 |
| B0A1B1B1 | B0A1B1B0 | B0A1B0A1 | B0A1B0A0 |
|  |  |  |  |
| A1A0B1A0 | A1A0B1A1 | A1A0B0B0 | A1A0B0B1 |
| A1B1A0A1 | A1B1A0A0 | A1B1A1B1 | A1B1A1B0 |

TABLE 5-continued

| A1B0A1A1 | A1B0A1A0 | A1B0A0B1 | A1B0A0B0 |
| A1A1B0A0 | A1A1B0A1 | A1A1B1B0 | A1A1B1B1 |

SUPERCOSET 2

| Coset 5 | Coset 6 | Coset 11 | Coset 8 |
|---|---|---|---|
| A0A0B1B1 | A0A0B1B0 | A0A0B0A1 | A0A0B0A0 |
| A0B1A0B0 | A0B1A0B1 | A0B1A1A0 | A0B1A1A1 |
| A0B0A1B0 | A0B0A1B1 | A0B0A1B0 | A0B0A0A1 |
| A0A1B0B1 | A0A1B0B0 | A0A1B1A1 | A0A1B1A0 |
| | | | |
| B1A0B0A0 | B1A0B0A1 | B1A0B1B0 | B1A0B1B1 |
| B1B1A1A1 | B1B1A1A0 | B1B1A0B1 | B1B1A0B0 |
| B1B0A0A1 | B1B0A0A0 | B1B0A1B1 | B1B0A1B0 |
| B1A1B1A0 | B1A1B1A1 | B1A1B0B0 | B1A1B0B1 |
| | | | |
| B0A0B0A1 | B0A0B0A0 | B0A0B1B1 | B0A0B1B0 |
| B0B1A1A0 | B0B1A1A1 | B0B1A0B0 | B0B1A0B1 |
| B0B0A0A0 | B0B0A0A1 | B0B0A1B0 | B1B0A1B1 |
| B0A1B1A1 | B0A1B1A0 | B0A1B0B1 | B1A1B0B0 |
| | | | |
| A1A0B1B0 | A1A0B1B1 | A1A0B0A0 | A1A0B0A1 |
| A1B1A0B1 | A1B1A0B0 | A1B1A1A1 | A1B1A1A0 |
| A1B0A1B1 | A1B0A1B0 | A1B0A0A1 | A1B0A0A0 |
| A1A1B0B0 | A1A1B0B1 | A1A1B1A0 | A1A1B1A1 |

SUPERCOSET 3

| Coset 15 | Coset 12 | Coset 1 | Coset 2 |
|---|---|---|---|
| A0A0A1A1 | A0A0A1A0 | A0A0A0B1 | A0A0A0B0 |
| A0B1B0A0 | A0B1B0A1 | A0B1B1B0 | A0B1B1B1 |
| A0B0B1A0 | A0B0B1A1 | A0B0B0B0 | A0B0B0B1 |
| A0A1A0A1 | A0A1A0A0 | A0A1A1B1 | A0A1A1B0 |
| | | | |
| B1A0A0B0 | B1A0A0B1 | B1A0A1A0 | B1A0A1A1 |
| B1B1B1B1 | B1B1B1B0 | B1B1B0A1 | B1B1B0A0 |
| B1B0B0B1 | B1B0B0B0 | B1B0B1A1 | B1B0B1A0 |
| B1A1A1B0 | B1A1A1B1 | B1A1A0A0 | B1A1A0A1 |
| | | | |
| B0A0A0B1 | B0A0A0B0 | B0A0A1A1 | B0A0A1A0 |
| B0B1B1B0 | B0B1B1B1 | B0B1B0A0 | B0B1B0A1 |
| B0B0B0B0 | B0B0B0B1 | B0B0B1A0 | B0B0B1A1 |
| B0A1A1B1 | B0A1A1B0 | B0A1A0A1 | B0A1A0A0 |
| | | | |
| A1A0A1A0 | A1A0A1A1 | A1A0A0B0 | A1A0A0B1 |
| A1B1B0A1 | A1B1B0A0 | A1B1B1B1 | A1B1B1B0 |
| A1B0B1A1 | A1B0B1A0 | A1B0B0B1 | A1B0B0B0 |
| A1A1A0A0 | A1A1A0A1 | A1A1A1B0 | A1A1A1B1 |

SUPERCOSET 4

| Coset 13 | Coset 14 | Coset 3 | Coset 0 |
|---|---|---|---|
| A0A0A1B1 | A0A0A1B0 | A0A0A0A1 | A0A0A0A0 |
| A0B1B0B0 | A0B1B0B1 | A0B1B1A0 | A0B1B1A1 |
| A0B0B1B0 | A0B0B1B1 | A0B0B0A0 | A0B0B0A1 |
| A0A1A0B1 | A0A1A0B0 | A0A1A1A1 | A0A1A1A0 |
| | | | |
| B1A0A0A0 | B1A0A0A1 | B1A0A1B0 | B1A0A1B1 |
| B1B1B1A1 | B1B1B1A0 | B1B1B0B1 | B1B1B0B0 |
| B1B0B0A1 | B1B0B0A0 | B1B0B1B1 | B1B0B1B0 |
| B1A1A1A0 | B1A1A1A1 | B1A1A0B0 | B1A1A0B1 |
| | | | |
| B0A0A0A1 | B0A0A0A0 | B0A0A1B1 | B0A0A1B0 |
| B0B1B1A0 | B0B1B1A1 | B0B1B0B0 | B0B1B0B1 |
| B0B0B0A0 | B0B0B0A1 | B0B0B1B0 | B0B0B1B1 |
| B0A1A1A1 | B0A1A1A0 | B0A1A0B1 | B0A1A0B0 |
| | | | |
| A1A0A1B0 | A1A0A1B1 | A1A0A0A0 | A1A0A0A1 |
| A1B1B0B1 | A1B1B0B0 | A1B1B1A1 | A1B1B1A0 |
| A1B0B1B1 | A1B0B1B0 | A1B0B0A1 | A1B0B0A0 |
| A1A1A0B0 | A1A1A0B1 | A1A1A1A0 | A1A1A1A1 |

Referring to Table 5, the 256 multidimensional symbol subsets are tabulated into sixteen cosets, with there being 16 members for each coset. The left most component is that of the fourth baud, the next is that of third baud, the next is that of second baud and the right most is that of first baud. The order of the components within a given member are predetermined; however, it should be understood that this order can be reversed, i.e., the first component can be for the first baud and the last component for the fourth baud.

According to the present invention, the arrangement of cosets and the members in each coset brings out the commonality of the components. This commonality reduces the number of calculations needed to compute the value of the branch cost as given by Equation 6. Hereafter, it will be seen that use of this commonality reduces computations in two ways. First, it reduces computations required to eliminate members within a coset. Second, costs calculated for one coset can be used in the other cosets. Hereafter, the preferred arrangement of the first embodiment of the present invention will be described, with the properties generated by such arrangements being also described.

In Table 5, the cosets are grouped into four sets. The set of four cosets is identified as a supercoset. Similarly, each coset is divided into four sets, with each set having four members. This set is identified as a subcoset. According to the present invention, the members within a coset are arranged so that the four members of a subcoset have a property that the left most component is common for all. As an example, subcoset 1 belonging to coset 15 is as follows:

| Fourth Baud | | | |
|---|---|---|---|
| A0 | A0 | A1 | A1 |
| A0 | B1 | B0 | A0 |
| A0 | B0 | B1 | A0 |
| A0 | A1 | A0 | A1 |

For the purpose of identification for each coset, the top most subcoset in each coset is identified as subcoset 1, with each one thereafter being progressively numbered until the bottom one, which is subcoset four. The four cosets which belong to the same supercoset have what is defined as a common three member property. This propery can be stated as follows. Any subcoset in a coset can be transformed to one of the subcoset in each of the other cosets belonging to the same supercoset by just changing the common components, i.e., the components within the same baud that are the same for all four members of the subcoset. Although the four components of four members in baud four consist of the same component, for this description and in the claims, they will be referred to in the plural, i.e., components. Likewise, wherever there is a repetition of a common component in the same baud, when referring to the group, the term "components" is used. These common components will be referred to as the common-subcoset-components. As an example, the subcoset

| A0 | A0 | A1 | A1 |
| A0 | B1 | B0 | A0 |
| A0 | B0 | B1 | A0 |
| A0 | A1 | A0 | A1 | belonging to coset 15 can be transformed to subcoset of coset 12.

| A1 | A0 | A1 | A1 |
| A1 | B1 | B0 | A0 |
| A1 | B0 | B1 | A0 |
| A1 | A1 | A0 | A1 |

In other words, by changing the first column of common subset components from A0's of subcoset 1 of coset 15 to A1's, B0's, or B1's one obtains, respectively, subcoset 4 of coset 12, subcoset 3 of coset 1, or subcoset 2 of coset 2, all of which are in the same supercoset. This type of relationship holds true for all cosets within all supercosets.

In addition to the commonality in one column of four component, for each subcoset there is commonality of two pairs of components in a second column. More particularly, for example, in coset 15, in the column for baud one, there are two common components of A1's and two common components of A0's. It is important to note that commonality is determined with reference to comparisons made between components of different members, not with components of the same member. Because each member has its components in a row, the commonality appears in the columns, although this could be reversed.

Referring to Table 5, there are sixteen submembers containing the components for baud three and baud two, which can be split into eight sets of two submembers each. In each subcoset, the component of each submember (consisting of two components) are the non-common components. In other words, with respect to each set, the components of each submember are non-common components relative to the components of the other submember when a comparison is made between components of the two submembers of the same baud. These sets are shown in Table 6.

TABLE 6

| Baud Three | Baud Two | | Baud Three | Baud Two | |
|---|---|---|---|---|---|
| FIRST GROUP | | | | | |
| A0 | A1 | (1) | A0 | A0 | (3) |
| A1 | A0 | | A1 | A1 | |
| B0 | B1 | (2) | B0 | B0 | (4) |
| B1 | B0 | | B1 | B1 | |
| SECOND GROUP | | | | | |
| A0 | B1 | (5) | A0 | B0 | (7) |
| A1 | B0 | | A1 | B1 | |
| B0 | A1 | (6) | B0 | A0 | (8) |
| B1 | A0 | | B1 | A1 | |

Submember sets (1), (2), (3) and (4) of the first group are common to the supercoset 3 containing cosets 15, 12, 1 and 2, as well as to the supercoset 4 containing cosets 13, 14, 3 and 0. Similarly, submember sets (5), (6), (7), and (8) of Group Two are common to supercoset 1 containing cosets 7, 4, 9, and 10 as well as supercoset 2 containing cosets 5, 6, 11 and 8. The subcosets in cosets 7, 4, 9, and 10 illustrate this point as follows in Table 7.

TABLE 7

| B0 | A0B0 | B1 | B0 | A0B0 | B0 | A1 | A0B0 | B0 | A1 | A0B0 | B1 |
|---|---|---|---|---|---|---|---|---|---|---|---|
| B0 | A1B1 | B1 | B0 | A1B1 | B0 | A1 | A1B1 | B0 | A1 | A1B1 | B1 |
| B0 | B0A0 | B0 | B0 | B0A0 | B1 | A1 | B0A0 | B1 | A1 | B1A1 | B0 |
| B0 | B1A1 | B0 | B0 | B1A1 | B1 | A1 | B1A1 | B1 | A1 | B0A0 | B0 |
| Coset 7 | | | Coset 4 | | | Coset 9 | | | Coset 10 | | |

It can be seen that the submembers

| | |
|---|---|
| A0 | B0 |
| A1 | B1 |
| B0 | A0 |
| B1 | A1 |

(two of the sets of Table 6) are common to the subcosets shown in Table 7. Additionally, the members of each subcoset are categorized into two pairs, with each pair having one of the sets. With respect only to the members of each pair of members, each submember forming part of the set is defined as the non-common portion of the member and the balance of each member that does not form part of the set is defined as the common portion of the member. In determining the member of each pair forming one of the sets with the minimum metric (cost), it can be determined by comparing only the summed costs of the two different components, thereby eliminating the need to sum the cost of all four components prior to comparing the cumulative metrics. Consequently, within each coset there are eight pairs of members having commonality, when compared with each other, in two common components. When further grouped into subcosets, each subcoset has common components for all members in one baud.

As a result of the commonality in two of the columns previously described, there is no commonality in the other two columns, i.e., the two columns for bauds three and two, as dictated by the encoder used in embodiment shown. More specifically, each of the four components A0, A1, B0, and B1 can be found, in differing members in both bauds three and two. The lack of commonality is contained within these two bauds. With this particular encoder, there will be commonality in two bauds, one with all components being in common and the other with two pairs being common. By selecting convolutional encoders having the above described commonality in two columns, with the four submembers of three bauds each being repeated in four cosets, the embodiments of the present invention have maximized the use of such commonality. However, other encoders have different patterns of commonality wherein the present invention would find use, even though such commonality may not be as useful. Moreover, with respect to the "common portion and the "non-common" portion of each branch, for the purposes of defining the invention in the claims, the components of each portion do not have to be adjacent to each other. For example, although the submembers of Table 6 comprise two "non-common components" which are adjacent to each other and two "common components" which are separated, other encoder schemes might lead to the non-common components being separated and so on.

As previously discussed in the cost calculations, it is necessary to determine which of the 16 members for each coset has the smallest cost. There is a cost associated with each member and that member having the lowest summed cost (minimum metric) of its components is to be determined. In doing the comparison within a given subcoset, the components for the fourth baud do not affect the elimination of a member. Likewise, when comparing the first pair of members and the second pair of members, the commonality in the first baud eliminates the cost of the components of the first baud from being a factor. For this step of the comparison, only the components of bauds two and three, i.e., the sets defined in Table 6, need to be considered. Moreover, this set reappears in eight cosets. Hence, the cost computations between pairs of submembers of Table 6 need to be done only once, even though these submembers occur in eight different subcosets. By doing the cost calculations for each set, there is a reduction of eight to one.

Moreover, as previously described, the components for bauds three, two and one, which define four submembers, are repeated four times. Therefore, the cost computations done for four submembers in one coset can be used for the submembers in three other cosets. Hence, the cost computation is reduced by a factor of four.

With reference to the first embodiment, another factor for reduction can be seen by looking at Table 2. As previously discussed, the outer point occurs only in one baud of a multidimensional-symbol-subset. In the first embodiment of the branch cost metric calculator 100 of FIG. 9 wherein the cost calculations are to be performed for each combination of inner and outer pointers, an algorithm to minimize the number of computations can be based on the following principle which we will denote as principle of algorithm one, which is used in the first embodiment. With algorithm one, as previously described, the slicer 102 of FIG. 9 computes the cost (metric or distance) of the nearest inner and outer point of each component (subset) to the received signal in each baud. According to the invention, if for any component in any baud the outer point is closer than the inner point, then for all subsequent bauds for computing the submember or member cost containing that component only inner points will be considered. Otherwise, the minimum of the costs of inner and outer point are again considered. In computing the branch cost, the cost of baud three is added to baud two and the resulting cost is added to the cost of baud one and the second resulting cost is added to the cost of baud four. With respect to the first embodiment, referring to the flow chart of FIG. 10, steps involved in the process of branch computation are as follows:

1. At block 110 slicer 102 of FIG. 9 computes the distance of the received point from the closest inner and outer points for each component in each baud, as specified in Equations 3, 4 and 5.

2. After a counter is incremented at block 111, at block 112, for the component for baud two, the determination is made as to whether the cost is smaller for the inner or outer point. The inner or outer point is chosen based upon whether inner cost is smaller or outer cost is smaller.

3. With the members arranged according to Table 5, the submember cost are formed for submembers of baud three and baud two. There are sixteen submembers which are shown in Table 6:

TABLE 6

| A0A0 | A0B1 | A0B0 | A0A1 |
|------|------|------|------|
| B1A0 | B1B1 | B1B0 | B1A1 |
| B0A0 | B0B1 | B0B0 | B0A1 |
| A1A0 | A1B1 | A1B0 | A1A1 |

The submember costs are calculated as follows. Referring to blocks 114, 116 and 118, if for any component in baud two, the minimum is for an outer point as determined at the block 114, then baud three is assumed to be an inner point at the block 118 and then for a submember containing that baud two component the cost of the inner point of the corresponding subset for baud three is added at the block 120. Otherwise, it is determined at the block 116 whether the inner or outer point of baud three has the minimum cost and at block 120 this minimum cost is added to the cost of the component at baud two. For example, for submember B0A0, component B0 represents baud three and component A0 represents baud two. If for component A0 the outer point is chosen, then for component B0 an inner point is chosen at the block 118. Otherwise, the minimum of the inner cost and outer cost for component B0 is chosen in baud three at the block 116. This is repeated through a loop including blocks 111 and 122 until these calculations have been done for all 16 of the above described submembers.

4. The sixteen submembers (two components), as previously described, are separated into 8 set (pairs) of Table 6, at block 124. The cost for each has already been determined. The costs of each pair of compared and the surviving submember with the lowest cost is selected at block 126. Since these pairs of submembers are in every subcoset, comparing their cost to eliminate the submeber of higher cost thus reduces the total number of comparisons to be made.

5. There will be eight survivor subbranches in the comparison process in the block 126. By individually adding the cost of the four components of baud one to each of these survivors, 32 costs are formed for three-component submembers, each of which will be a sum of three costs, as illustrated in Table 7.

TABLE 7

Minimum of (A0A0 and A1A1),
  then add cost of [A0, B1, B0, and A1]
Minimum of (B1B1 and B0B0),
  then add cost of [A0, B1, B0, and A1]
Minimum of (A0A1 and A1A0),
  then add cost of [A0, B1, B0, and A1]
Minimum of (B0B1 and B1B0),
  then add cost of [A0, B1, B0, and A1]
Minimum of (A0B0 and A1B1),
  then add cost of [A0, B1, B0, and A1]
Minimum of (B1A1 and B0A0),
  then add cost of [A0, B1, B0, and A1]
Minimum of (A0B1 and A1B0),
  then add cost of [A0, B1, B0, and A1]
Minimum of (B1A0 and B0A1),
  then add cost of [A0, B1, B0, and A1]

Figure 11:
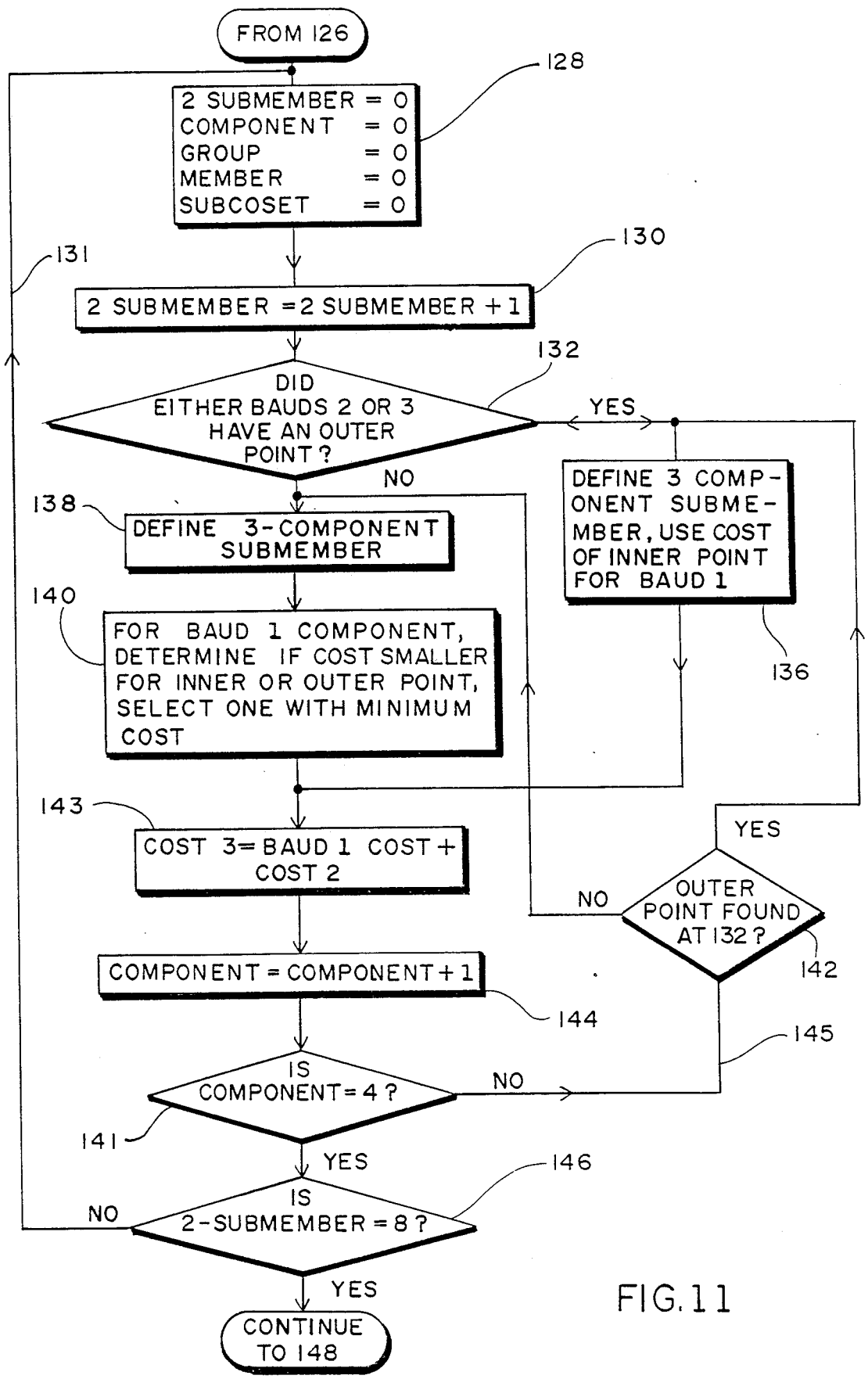
FIG. 11 is a flow chart of the branch metric calculator of the present invention.

From Table 7, it is seen that four three-component submembers result when each surviving two-component submember has the components of baud one added thereto, which are all of the components A0, B1, B0 and A0. This addition of baud one components, one at a time, generates half of the three-component submembers that exist in Table 5. Utilizing this relationship, the flow chart of FIG. 11 demonstrates how the three-component submembers are generated. Again the principle of algorithm one is applied. Counters for the submembers, components, and other variables used later are initialized at block 128 and the submember counter is incremented at block 130. As mandated by loop 131, for each of the two-component submembers for bauds three and two, at block 132 a determination is made as to whether each two-component submember has an outer point in either component. If there is an outer point therein, then the component for baud one (as determined by a component counter) is assumed to be an inner point and one of four three-component members formed by use of the current two-component member is defined at block 136. If there is no outer point, then one of the four three-component members derived from a given two-component member is defined at block 138. Based upon the component values of 1, 2, 3, and 4, the baud one component added is A0, B1, B0 and A1, respectively, at the blocks 136 and 138. At block 140, the costs of the inner and outer points for baud one are compared and the minimum cost component of the two is selected. Once the appropriate cost has been determined at the block 140 or the block 136, then the cost of the three-component submember is calculated at block 143 by adding the two-component member cost to the appropriate cost of the component for baud one. The component counter is incremented at block 144. Via decision blocks 141 and 142, each of the four components are used. Each of the four three-component submembers having as part thereof one of the eight two-component submembers is formed via loop 145. After all eight two-component submembers are processed through the loop 131, the program exits via decision block 146.

6. The three-component submembers from which the subcosets can be constructed are shown in Table 8.

TABLE 8

| A0A1A1 | A0A1B0 | A0B1B0 | A0B1A1 |
| B1B0A0 | B1B0B1 | B1A0B1 | B1A0A0 |
| B0B1A0 | B0B1B1 | B0A1B1 | B0A1A0 |
| A1A0A1 | A1A0B0 | A1B0B0 | A1B0A1 |
| | | | |
| A0A0B0 | A0A0A0 | A0B0A0 | A0B0B1 |
| B1B1B1 | B1B1A1 | B1A1A1 | B1A1B0 |
| B0B0B1 | B0B0A1 | B0A0A1 | B0A0B0 |
| A1A1B0 | A1A1A0 | A1B1A0 | A1B1B1 |
| | | | |
| A0A0B1 | A0A0A1 | A0B0A1 | A0B0B0 |
| B1B1B0 | B1B1A0 | B1A1A0 | B1A1B1 |
| B0B0B0 | B0B0A0 | B0A0A0 | B0A0B1 |
| A1A1B1 | A1A1A1 | A1B1A1 | A1B1B0 |
| | | | |
| A0A1A0 | A0A1B1 | A0B1B1 | A0B1A0 |
| B1B0A1 | B1B0B0 | B1A0B0 | B1A0A1 |
| B0B1A1 | B0B1B0 | B0A1B0 | B0A1A1 |
| A1A0A0 | A1A0B1 | A1B0B1 | A1B0A0 |

Referring to Table 8, as previously mentioned, the four three-component submembers of bauds three, two, and one found in each coset are repeated four times within a given supercoset. The four three-component submembers will be identified as a submember group. Consequently, within each supercoset, there are only four unique submember groups and among all the supercosets, there are 16 unique submember groups. In Table 8, the columns of submember groups are arranged in columns, going from left to right, from supercosets three, four, one, and two, respectively.

Figure 12:
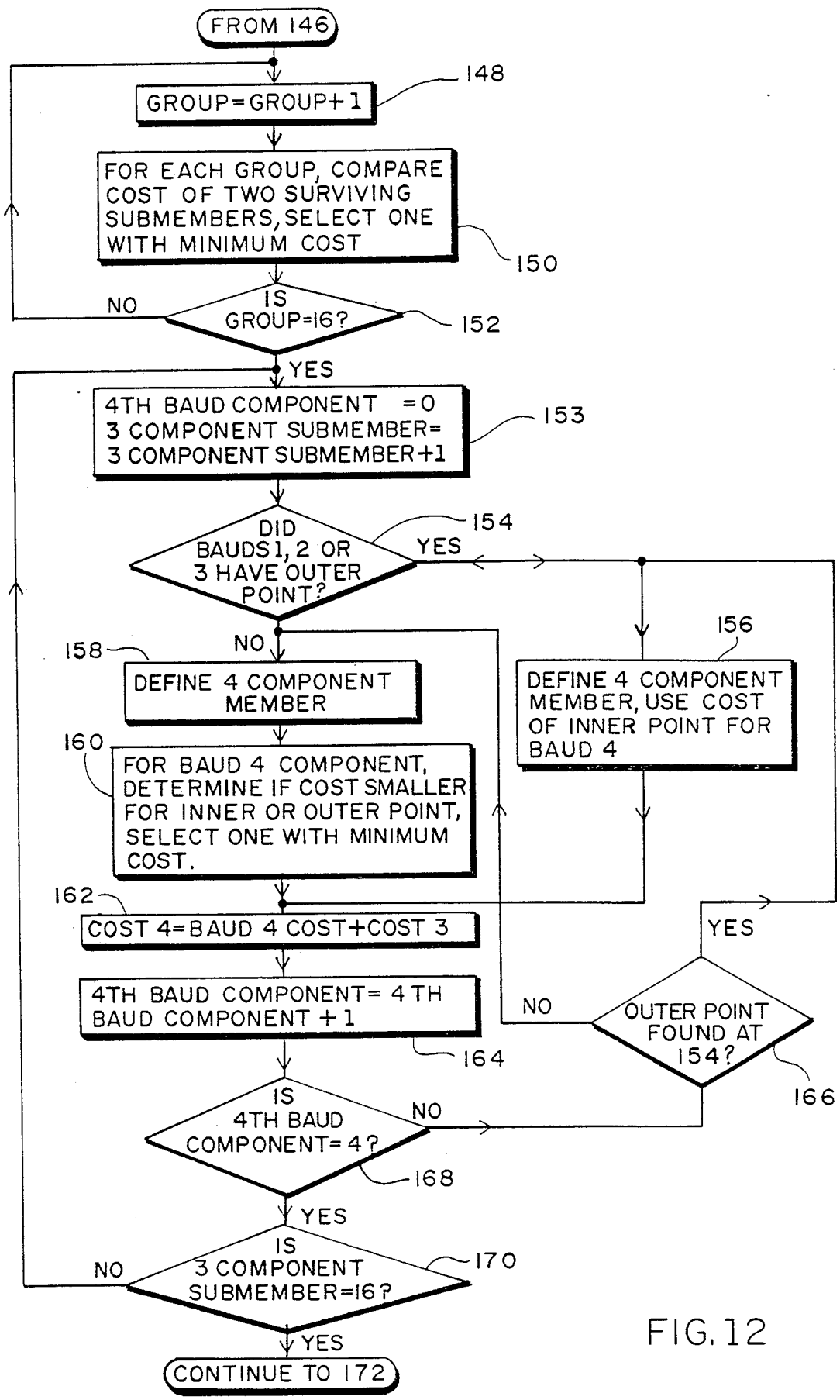
FIG. 12 is a flow chart of the branch metric calculator of the present invention.
Figure 13:
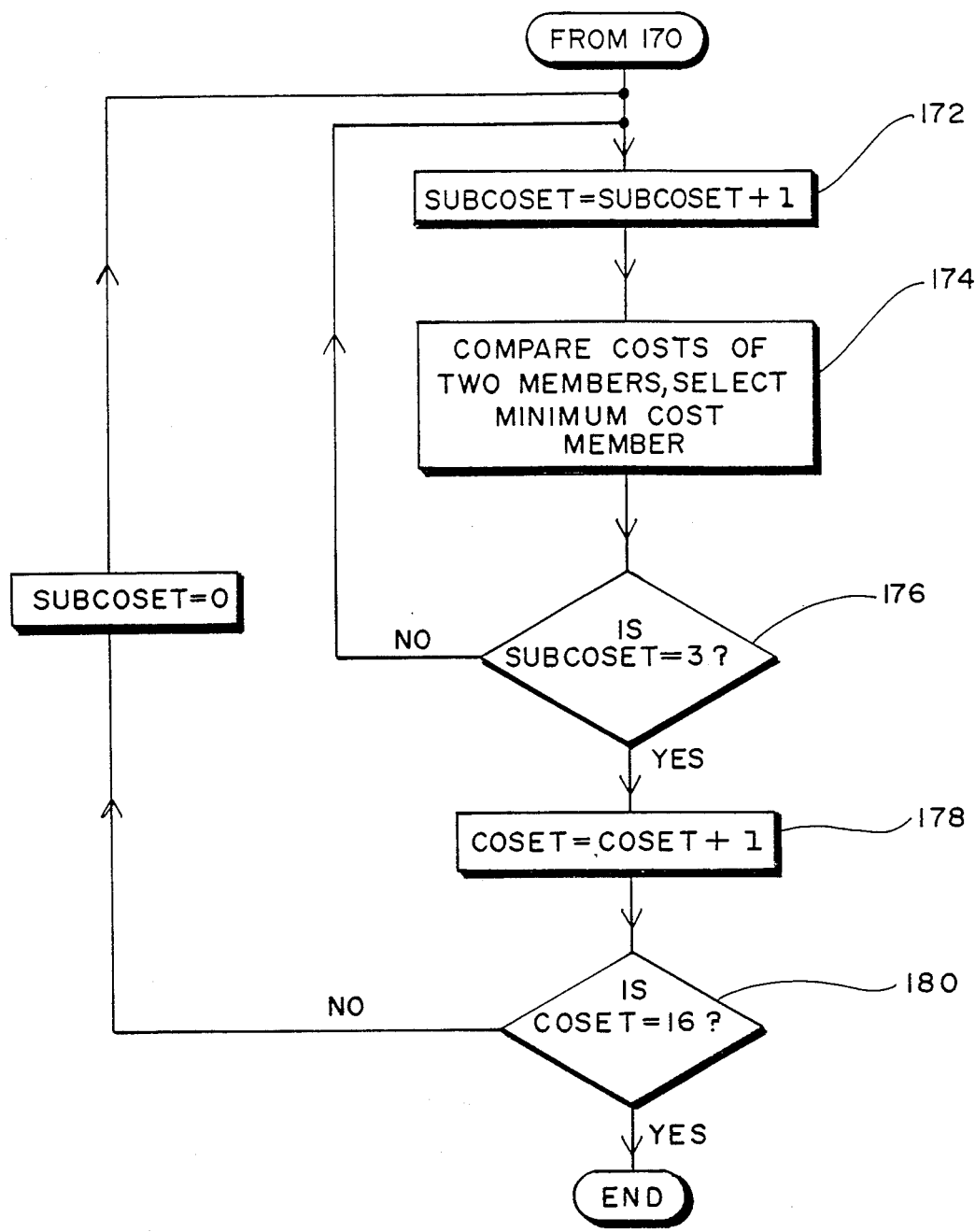
FIG. 13 is a flow chart of the branch metric calculator of the present invention.
Figure 14:
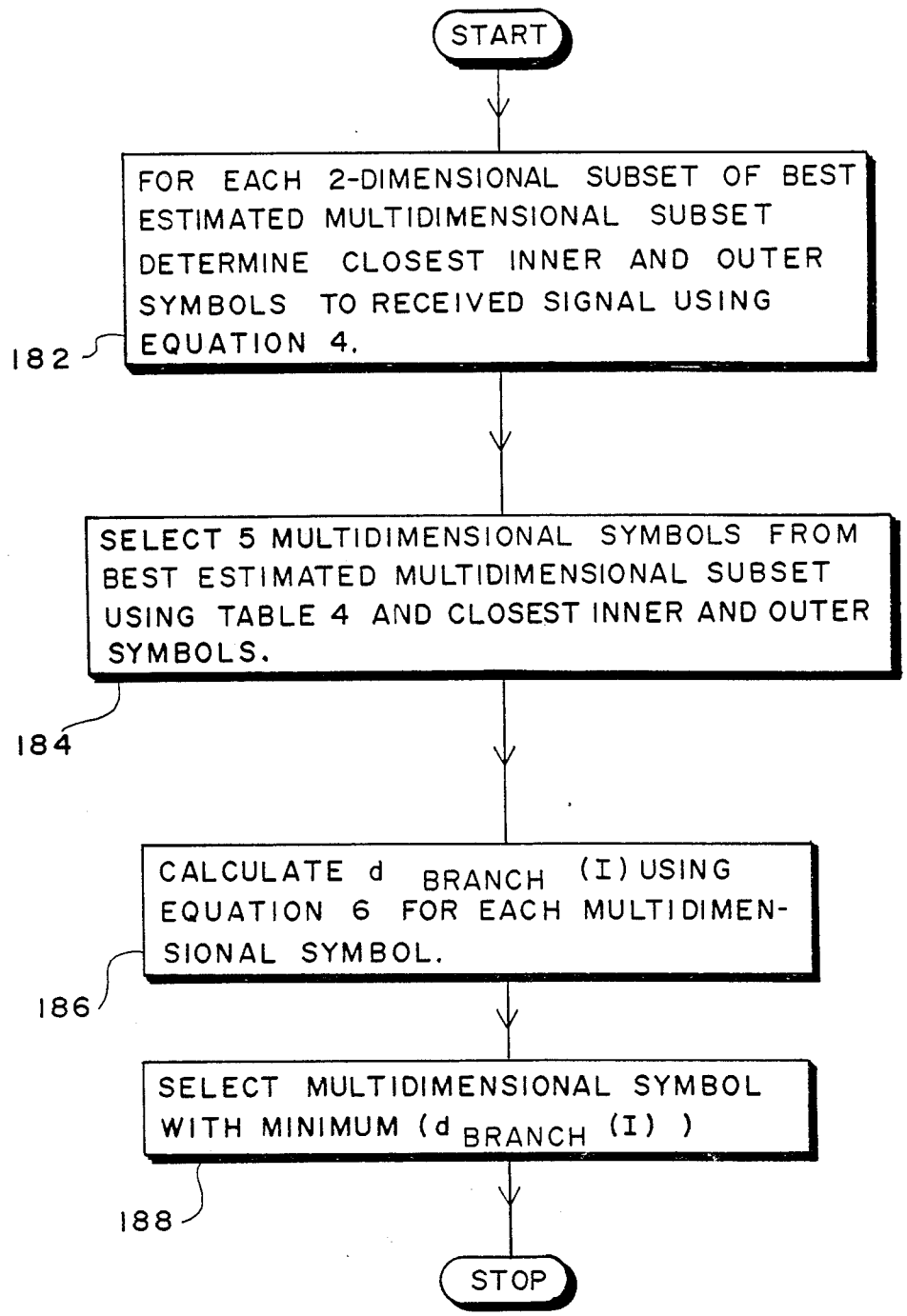
FIG. 14 is a flow chart of the Viterbi decoder of the present invention.

Referring to Table 8, all of the 64 three-component submembers for bauds three, two and one are shown. Out of these 64 submembers, 32 have been eliminated in block 126 by taking the commonality of the two-component submembers. Referring to the flow chart of FIG. 12, for each of the submember groups, the cost of the two surviving three-component submembers are compared, with the one having the minimum cost being selected and retained. There will be sixteen in these in total. Referring to the flow chart, after the submember group counter is incremented at block 148 the one surviving three-component submember is selected at block 150 for each submember group as dictated by block 152.

7. Next, the member of each subcoset with the least cost is formed by adding to the cost of the one surviving three-component submember to the cost of the corresponding component of baud four. At this point there is left four members and their associated cost for each coset, i.e., one for each subcoset. Three comparisons are made for each coset to obtain the minimum cost member for each coset with an allowable sequence.

Referring to the flow chart of FIG. 12, again the rule is that, if the prior three-component submember contained an outer point as determined at block 154, then to the submember defined at block 156, the cost of the inner point for baud four is added at block 162. If there is no outer point, and for the member defined at block 156, the smaller cost of the two costs, one for the inner point and one for the outer point, is determined at block 150. As to the four-component members being defined in blocks 156 and 160, this is merely a matter of sequentially associating the baud four component (subset) to the appropriate submember. Each surviving three-component branch has the four components of baud four added thereo to generate the four members in four cosets of the same supercoset, as defined by the loops having blocks 164, 168 and 166. This is repeated for each surviving three-component submember as dictated by the loop having blocks 170 and 153. The cost of baud four is added to the three-component cost at block 162 and this is repeated for all 64 members.

At this point, there is left the costs of four members for each coset. At block 174 three comparisons are made for each coset to obtain the minimum cost member. Due to blocks 172, 176, 178, and 180, the comparisons are made three times for each coset, so that a single member and member cost is arrived at for each of the 16 cosets with an allowable sequence. The number of computations excluding the slicer is shown in Table 9.

TABLE 9

| Operation | Addition | Comparison |
|---|---|---|
| 1. If for baud two the inner point is chosen then add cost of baud two to minimum of (inner cost, outer cost) of baud three; else add cost of baud two to cost of inner point of baud three. | 16 | 8 |
| 2. Subdivide the sixteen two components to eight components of two each and choose the minimum in each component. | | 8 |
| 3. If either baud two or baud three contains no outer point then add minimum of (inner cost, outer cost) of baud one to the combined costs of bauds two and three; else add the inner cost of baud one to combined costs of bauds two and three. | 32 | 4 |
| 4. Divide the 32 members into 16 components and compare the cost in each component. | | 16 |
| 5. If either baud one, two or three contains no outer point then add minimum of (inner cost, outer cost) for baud four, else add inner cost for baud four. | 64 | 4 |
| 6. Compare the four members in each coset to choose the minimum cost in each coset. | | 48 |
| TOTALS | 112 | 88 |

There is a tenfold reduction in the number of comparison and the number of additions is reduced by a factor of 34. While this is a suboptimum decoder, its performance is close to the ideal maximum likelihood decoder for high signal to noise ratio.

Contrary to the first embodiment, in the second embodiment of the present invention, the branch metric calculator 100 of FIG. 9 does not take into account whether a point is an inner point or an outer point. A second algorithm is used which requires a lesser number of operations than algorithm one of the first embodiment and will be referred to as algorithm two. In algorithm two no distinction is made between the cost of inner and outer points. The algorithm will now be described in detail and basically results in a simplified version of the first and has the following steps, with Tables 7 and 8 being again applicable. (1) For each baud, the cost of the closest point in each component (subset) to the received point in slicer 102 as previously described. (2). Next, the cost of the component in baud two is added to the cost of the component in baud three to form sixteen costs for submembers with two-components. (3) Next, eight comparisons of the sixteen submembers are made, which leaves eight submembers. Each comparison involves a pair of submembers having the same common component in baud one. (4) The cost of component of baud one is added to the cost of the surviving submembers. There are 32 additions and 32 new costs will be formed. (5) Sixteen comparisons are made between pairs of three-component submembers of the same subcoset to come up with sixteen three-component member costs. (6) The cost of the appropriate component in baud four is added to the three-component submember to form 64 costs of 64 branches. (7). The four costs in each coset are compared to find the lowest cost of each coset.

The number of additions for algorithm two is the same as the number of additions for algorithm one. The number of comparisons for algorithm 2 is less than the number of comparisons for algorithm one by sixteen. However the overall complexity of algorithm two is smaller than that of algorithm one. For example, the slicer 102 of FIG. 9 for algorithm two has do half the number of computations as the slicer for algorithm one, since the former does not to search for inner and outer points separately. In algorithm one, for the case of all inner points the members are needed during each addition. These members are tested to determine if the previous submember contains any outer point or not. Depending upon whether the previous submembers contained any outer point or not the subsequent instructions will have to be branched to the right location. This increases the number of instruction cycles needed to code the algorithm.

Generally, the Viterbi decoder 104 for the first embodiment of the present invention in the receiver 80 uses the received multidimensional signals to estimate the original path of the encoder 18 through the trellis, such trellis being discussed with respect to FIG. 8. The maximum likelihood path is determined by finding the possible sequence of multidimensional symbol subsets (which trellis path) which is closest to the sequence of received multidimensional signals. During every frame, the receiver computes the minimum cost path and from the path history, determines the estimated multidimensional symbol.

As is well-known, the Viterbi decoder 104, during each frame (group interval) extends each of the surviving paths to their successor state at the next frame. The metric (cost) of the extended path is obtained by adding the metric of the survivor to the branch metric of the corresponding branch which extends the path. The survivor at the next frame at a given state is found by comparing the metrics of all the extended paths which connect to a given state and choosing the minimum.

More specifically, extending the paths' histories can be mathematically characterized by computing:

$$c(i, n) = \underset{j}{\text{Minimum}}\{c(j, n-1) + r(i,j)\} \quad \text{(Equation 7)}$$

where $c(j, n-1)$ is the surviving metric of the jth state at time $t=(n-1)T_{frame}$, $r_{(i,j)}$ is the branch metric of the output branch which connects the jth state at time $t=(n-1)T_f$ to the ith state at $t=nT_f$. $c(i, n)$, the cost at the ith state at time $t=nT_f$, is obtained by minimizing over all j which are connected to state i. Thus, the path history of the surviving paths is extended. Once the path history is extended the decoder 104 finds the minimum cost path among the survivors, and from the path history outputs the best estimate of the multidimensional symbol subset for the group interval to a convolutional decoder 106. The delay between the present frame and the present estimate (of the past symbol) can be 3v frames, where v is the constraint length of the convolutional encoder 18 and in this case is 6.

From the retained knowledge of the received multidimensional signal sequence and from the knowledge of the closest multidimensional symbol subset of the maximum likelihood path, the best estimate of the transmitted multidimensional symbol (point) is obtained. From the estimated, transmitted multidimensional signal the convolutional decoder 106 produces the packet data. Finally a serial to parallel converter 108 converts this packet to serial data.

The Viterbi decoder 104 of FIG. 9 for the second embodiment of the present invention is exactly the same conventional arrangement, except as follows. Once the minimum cost sequence is found and the corresponding member has been estimated at the receiver, it is necessary to determine (with knowledge of the corresponding received sequence, i.e., received multidimensional signal) which sequence of inner and outer points is closest to the received sequence which has just been estimated. As previously described and shown in Table 4, each member can be composed of five possible signal combinations of inner and outer points (2-dimensional symbols). The inner and outer points of the signal constellation are defined in Tables 2 and 3. It has been discovered by the inventors that in the second embodiment the component costs of nearest ideal points can be used in the branch cost calculations (regardless of whether the nearest point is an inner or outer point) without significant loss in performance, if any resultant impermissible sequence of inner and outer signal points is corrected in the Viterbi decoder. After the determination of the best estimate of a member (which forms a part of the minimum cost path), there is known (1) the received multidimensional signal, i.e., multidimensional point (symbol) received, and (2) the best estimate of the member, i.e., a multidimensional symbol subset. Instead of merely selecting the ideal multidimensional symbol (four 2-dimensional symbols) from the multidimensional symbol subset that is closest to the received multidimensional signal, the Viterbi decoder 104 calculates $d_{BRANCH}(I)$ of Equation 6 five times, one for each of the five combinations of Table 4. In Equation 6, the "L" term is defined by the known member and the "K" term is defined by the particular sequence of inner and outer points. Consequently, there are five summed costs associated with the five combinations, and the combination with the minimum (smallest) summed cost is selected to be the multidimensional symbol provided to the convolutional decoder 106.

The slicer output of the cost of the closest (in Euclidean distance) 2-dimensional symbol for each 2-dimensional symbol subset for each baud is used by the branch cost calculator. However, for the Viterbi decoder 104 of FIG. 9, the slicer must provide for each best estimated member (multidimensional-symbol-subset) the cost of the closest inner point and outer point, but only for those 2-dimensional symbol subsets of the best estimated member. Referring to the flow chart of FIG. 16, this is done at block 182 for each best estimated member determined by the Viterbi decoder. Consequently, there are two 2-dimensional costs for each baud for a given best estimated member. At block 184, five multidimensional symbols are selected from the best estimated multidimensional-symbol-subset (member) that have the sequences of inner and outer 2-dimensional symbols (components) shown in Table 4. At block 186, the 2-dimensional cost provided above are summed to define a member (multidimensional cost), i.e. $d_{BRANCH}(I)$ of Equation 6, for each of the five multidimensional symbols. At block 188, the multidimensional symbol with the minimum multidimensional cost (metric) is selected by the Viterbi decoder to be outputted to the convolutional decoder 106 and is defined as being the best estimated multidimensional symbol selected from the best estimated multidimensional-symbol-subset based upon the knowledge of the received multidimensional signal and the requirement of meeting one of the permissible sequences of Table 4.

For the purpose of this disclosure including the claims "multidimensions" shall mean more than 2-dimensions.

The modem in which the present invention is implemented is a microprocessor based modem. As will be appreciated by those in the art, the microprocessor-based modem control and data processing circuits also typically include the usual data storage element (e.g., ROM for program control storage and the like, and RAM for variable input/output/intermediate result data, etc.) conventionally associated with a microprocessor CPU for performing desired manipulation of digital signals in accordance with a stored program. In the presently preferred exemplary embodiment, these already present microprocessor CPU, ROM and RAM elements are also utilized to perform the functions of the present invention. With the present invention, the modem functions are implemented in Texas Instrument's TMS 32020 processors. With respect to FIG. 1, all of the transmitter modem functions therein are preferable, but not necessarily, performed by the digital signal processor. As is well-known, after filtering in block 30, a D/A converter and antialasing filters are used. With respect to FIG. 9, all of the receiver modem functions of FIG. 9 are preferably, but not necessarily, performed by the digital signal processor. As is well-known, prior to demodulation, the received signal is processed by an A/D converter and filters.

Referring back to the discussion of the convolutional encoder of FIG. 7, the dependence of $y_n^3$, $y_n^2$, $y_n^1$ and $y_n^0$ on $x_n^7$, $x_n^6$, $x_n^5$ and $x_n^4$ in Equation 1 can be expressed by the vector:

$$\begin{bmatrix} x_n^7 & x_n^6 & x_n^5 \\ x_n^7 & x_n^6 & x_n^4 \\ x_n^7 & x_n^5 & x_n^4 \\ x_n^6 & x_n^5 & x_n^4 \end{bmatrix}$$ (Equation 8)

where the first row corresponds to $y_n^3$, the second row to $y_n^2$, the third row to $y_n^1$ and the fourth row to $y_n^0$. By interchanging the rows, a total of 24 different vectors can be obtained. Since for each arrangement of the vector there is a convolutional encoder, it then follows that there are 24 different convolutional encoders which can be realized and for each of the encoders a receiver with reduced number of computations-using the principles of this invention-can be designed.

With respect to FIG. 7, as merely a matter of convenience the unchanged bits $y_n^4$ through $y_n^{28}$ are shown as being part of the inputs and outputs of the convolutional encoder, although they pass through the convolutional encoder unchanged and of that group only bits $y_n^4$ through $y_n^7$ are used by the encoder. However, with respect to the claims, it is clear that the unchanged bits do not have to be considered as part of the convolutional encoder. The convolutional encoder outputs ($y_n^7 y_n^6 y_n^5 y_n^4 y_n^3 y_n^2 y_n^1 y_n^0$) satisfy the parity check equation:

$$\underline{y}H^T = \underline{0} \qquad \text{(Equation 9)}$$

where $$\underline{y} = (y_n^7 y_n^6 y_n^5 y_n^4 y_n^3 y_n^2 y_n^1 y_n^0)$$

$$\underline{H} = (H^8(D) H^7(D) H^6(D) H^5(D) H^4(D) H^3(D) H^2(D) H^1(D) H^0(D))$$

where D is the delay operator and T means transpose. Here $$H^i(D) = a_v D^v \oplus a_{v-1} D^{v-1} \oplus 0 \ldots a_0$$

where $i = 0 \ldots 7$ $a_1 = 0$ or 1 and $1 = 0 \ldots v$
where v is the constraint length of the encoder. In the present embodiment, the constraint length of the encoder is six, since there are six shift registers. The concept of the parity check equation and constraint length are well-known in the literature of convolutional codes as shown by U.S. Pat. No. 4,601,044 to Kromer et al. For the present encoder the parity check equation is given by $$P = y_{n-6}^7 \oplus y_{n-2}^7 \oplus y_{n-1}^7 \oplus y_n^7 \oplus y_{n-6}^6 \oplus y_{n-5}^6 \oplus \qquad \text{(Equation 10)}$$

$$y_{n-4}^6 \oplus y_n^6 \oplus y_{n-6}^5 \oplus y_{n-4}^5 \oplus y_{n-3}^5 \oplus y_{n-2}^5 \oplus$$

$$y_{n-1}^5 \oplus y_n^5 \oplus y_{n-6}^4 \oplus y_{n-5}^4 \oplus y_{n-2}^4 \oplus y_{n-1}^4 \oplus$$

$$y_n^4 \oplus y_{n-6}^3 \oplus y_{n-5}^3 \oplus y_{n-3}^3 \oplus y_n^3 \oplus y_{n-6}^2 \oplus$$

$$y_{n-4}^2 \oplus y_n^2 \oplus y_{n-6}^1 \oplus y_{n-5}^1 \oplus y_{n-4}^1 \oplus y_{n-3}^1 \oplus$$

$$y_{n-2}^1 \oplus y_{n-1}^1 \oplus y_n^1 \oplus y_{n-6}^0 \oplus y_{n-3}^0 \oplus y_n^0 = 0$$

The total number of terms in the parity check equation is an even number. As a result, if each of the output of the encoder is inverted, i.e., $y_n^i$ goes to $\bar{y}_n^i$, then P is still zero, because of the even number of terms in the parity check equation. Whenever there is a phase hit of 180 degrees, the received points are 180 degrees from the transmitted points. Under this condition, the received 2-dimensional subsets are changed as follows:

$$(y_n^{2k-1} y_n^{2k-2}) \text{ goes to } (\bar{y}_n^{2k-1} \bar{y}_n^{2k-2})$$

As we pointed out earlier, the parity check equation P remains zero even though $y_n^i$ goes to $\bar{y}_n^i$. In other words, for all the various encoders, even with 180 degrees phase shift, the output sequence satisfies the parity check equation.

Figure 15:
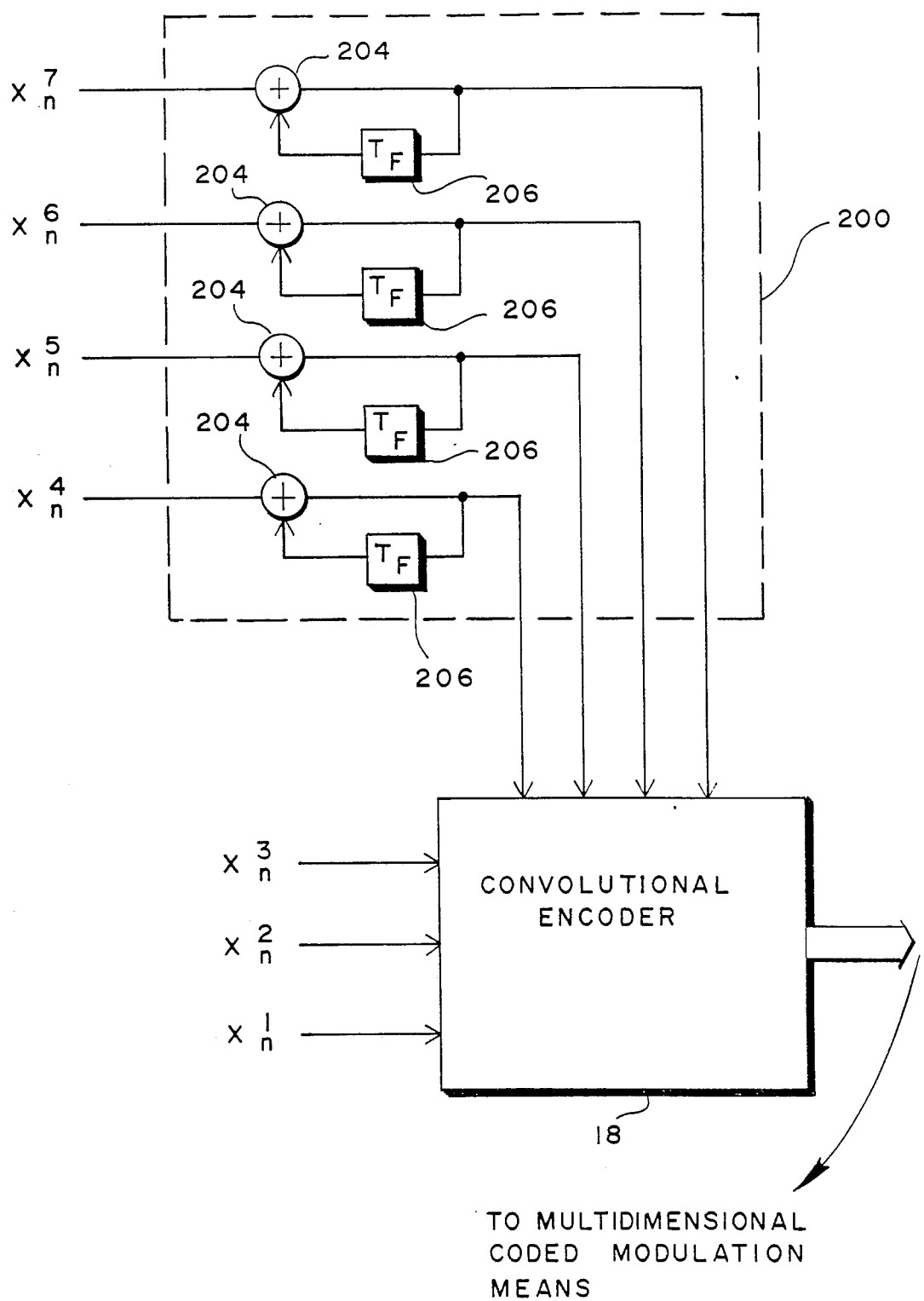
FIG. 15 is a schematic diagram of differential encoding for the convolutional encoder of FIG. 7.

As shown in another embodiment, the input to the convolutional encoder 18 of FIG. 1 can be differentially encoded by a differential encoder 200 as shown in FIG. 15, and the output to the convolutional decoder 106 of FIG. 9 can be differentially decoded by a differential decoder 202. In all other respects, this alternative embodiment is the same as the implementation shown in FIGS. 1 and 9. By differentially encoding those input bits to the convolutional encoder which are inverted in the process of 180 degrees phase shift, these bits can be recovered exactly. To differentially encode a sequence of bits $x_{n-1}, x_n, x_{n+1} \ldots$ to a sequence of bits $z_{n-1}, z_n, z_{n+1} \ldots$, the following operation is performed:

$$z_n = z_{n-1} \oplus x_n \quad \text{(Equation 11)}$$

To recover the bits of differentially decoded $x_n, x_{n+1}, \ldots$ from $z_n, z_{n+1}, \ldots$, we perform the operation of:

$$x_n = z_n \oplus z_{n-1} \quad \text{(Equation 12)}$$

From Equation 12 it can be seen that the sequence $x_n, x_{n+1}, \ldots$ can be recovered from the sequence $z_n, z_{n+1}, \ldots$ or the inverted sequence $\bar{z}_n, \bar{z}_{n+1}, \ldots$. In other words, the following 180 degrees rotated bits yield $x_n$ also as follows: $x_n = \bar{z}_n \oplus \bar{z}_{n-1}$. As a result, all of the previously described encoders (24 in number) have protection from 180 degrees phase hit. FIG. 7 illustrates one of these 24 possibilities. The other 23 possibilities would have the bits $y_n^4$ through $y_n^7$ of FIG. 7 connected to the modulo two adders in a manner dictated by Equation 8, with the remainder of the structure of the encoder remaining the same.

Figure 16:
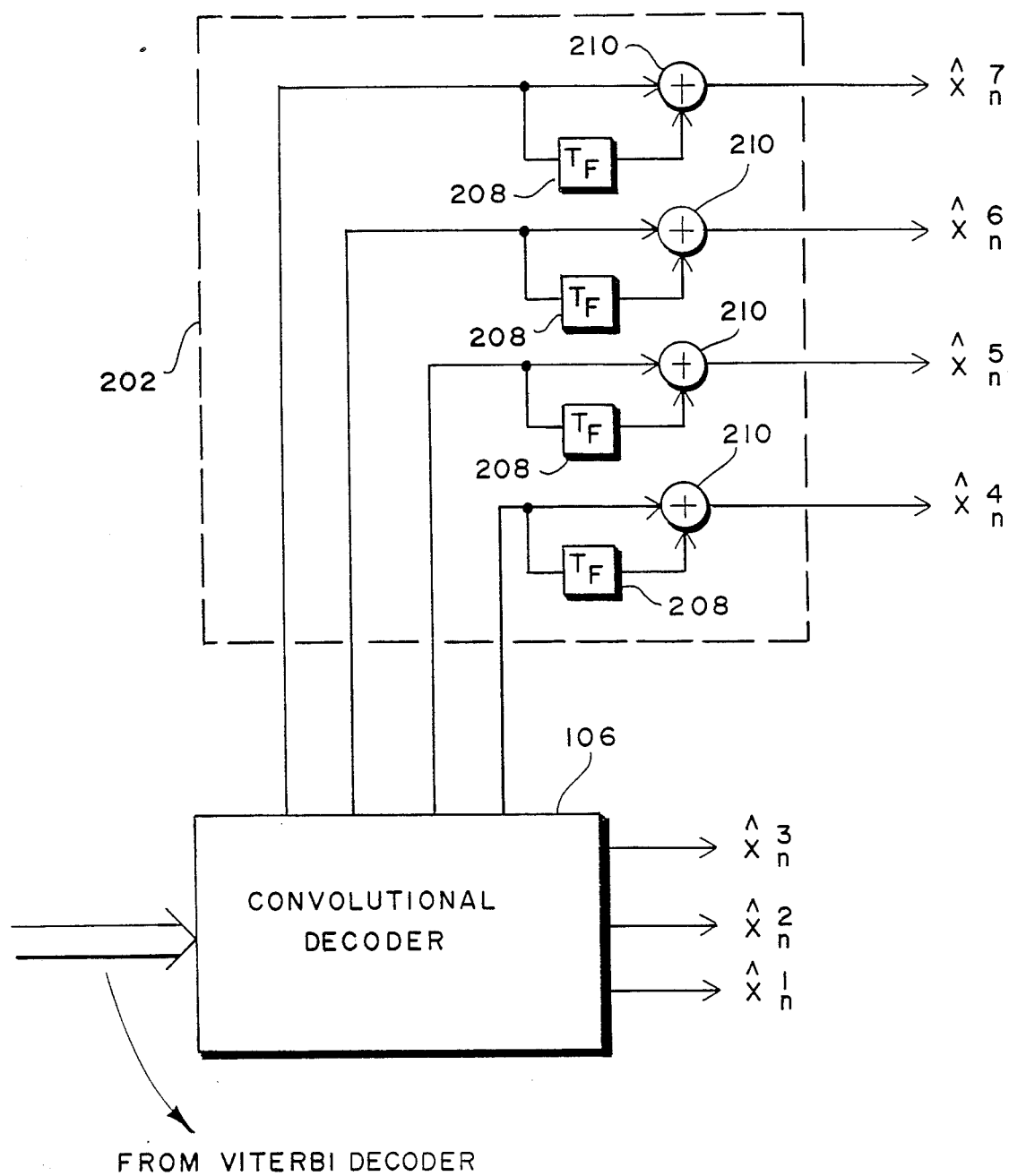
FIG. 16 is a schematic diagram of differential decoding for the convolutional decoder of FIG. 9.

The equations implemented in the differential encoder 106 of FIGS. 7 and 16 are as follows:

$$x_n^7 = y_n^7$$
$$x_n^6 = y_n^6$$
$$x_n^5 = y_n^5$$
$$x_n^4 = y_n^4$$
$$x_n^3 = y_n^7 D^7 \oplus y_n^6(D^3 \oplus D^5 \oplus D^6 \oplus D^7) +$$
$$y_n^5(D \oplus D^4 \oplus D^5 \oplus D^7) + y_n^4(1 \oplus D \oplus D^2 \oplus D^6 \oplus D^7) +$$
$$y_n^3(D \oplus D^3 \oplus D^4 \oplus D^6 \oplus D^7) \oplus y_n^2(1 \oplus D \oplus D^2 \oplus$$
$$D^3 \oplus D^5 \oplus D^7) + y_n^1(1 \oplus D^2 \oplus D^4 \oplus D^5 +$$
$$D^6 \oplus D^7) \oplus y_n^0(1 \oplus D^2 \oplus D^3 \oplus D^4 \oplus D^7)$$
$$x_n^2 = y_n^7(1 \oplus D^2 \oplus D^3 \oplus D^4 \oplus D^5 \oplus D^6) \oplus y_n^6(1 \oplus$$
$$D \oplus D^3 \oplus D^4 \oplus D^6) \oplus y_n^5(D^2 \oplus D^3 \oplus D^5 \oplus D^6) \oplus$$
$$y_n^4(1 \oplus D^6) \oplus y_n^3(D \oplus D^3 \oplus D^6) \oplus y_n^2(1 \oplus D \oplus D^2 \oplus D^5 \oplus$$
$$D^6) \oplus y_n^1(D^4 \oplus D^6) \oplus y_n^0(D \oplus D^2 \oplus D^4 \oplus D^5 \oplus D^6)$$
$$x_n^1 = y_n^7(1 \oplus D \oplus D^5) \oplus y_n^6(D^3 \oplus D^4 \oplus D^5) \oplus$$
$$y_n^5(1 \oplus D \oplus D^2 \oplus D^3 \oplus D^5) \oplus y_n^4(1 \oplus D \oplus D^4 \oplus D^5) \oplus$$
$$y_n^3(D^2 \oplus D^4 \oplus D^5) \oplus y_n^2(D^3 \oplus D^5) y_n^1(1 \oplus D \oplus D^2 \oplus$$
$$D^3 \oplus D^4 \oplus D^5) \oplus y_n^0(D^2 \oplus D^5)$$

If $y_n^i$ goes to $\bar{y}_n^i$ with a 180 degrees phase hit, then $x_n^7$ goes to $\bar{x}_n^7$, $x_n^6$ goes to $\bar{x}_n^6$, $x_n^5$ goes to $\bar{x}_n^5$ and $x_n^4$ goes to $\bar{x}_n^4$, $x_n^3$ goes to $\bar{x}_n^3$, $x_n^2$ goes to $\bar{x}_n^2$ and $x_n^1$ goes to $\bar{x}_n^1$.

The specific implementation of differential encoding is illustrated in FIGS. 15 and 16 for the convolutional encoder 18 of FIG. 7. In FIG. 15, the differential encoder 200 takes $x_n^4$ through $x_n^7$ (the bits that are inverted in this example) and processes each through an Exclusive Or 204 and feedback loop with a delay element 206 of one group interval (labeled $T_F$) to perform the operation of Equation 11. In FIG. 16, the output bits (that can be inverted) of the convolutional decoder 106 are each differentially decoded by a feedforward loop with a delay element 208 of one group interval and an Exclusive Or 210.

Although particular embodiments of the invention have been shown and described here, there is no intention to thereby limit the invention to the details of such embodiments. On the contrary, the intention is to cover all modifications, alternatives, embodiments, usages and equivalents of the subject invention as fall within the spirit and scope of the invention, specification and the appended claims.

We claim:

1. In a modulation-demodulation system for transmitting a plurality of information bits over a band limited channel, said system including a transmitter having convolutional encoder means, said convolutional encoder means each group interval providing one of a plurality of members of a coset, said coset being one of a plurality of cosets with each of said cosets being associated with a unique permissible transition of said convolutional encoder means from a given present state to one of a plurality of next states, each said group interval having a plurality of bauds, each of said members having a plurality of components with each of said components being associated with a unique one of said bauds, said system further including a receiver having branch cost calculator means for selecting one of said members from each of said cosets for said group interval based upon said selected member having associated therewith a minimum member cost relative to a plurality of member costs of the other said members of said coset, each of said member costs being a sum of a plurality of component costs for said components of one of said members, the improvement comprising:

said convolutional encoder means being designed to provide at least one group of at least two of said members of one of said cosets with each of said members of said group having a non-common portion and a common portion, each of said non-common portions including at least one non-common component which is different between said at least two members and each of said common portions including at least one common component which is the same between said at least two members;

said branch cost calculator means having comparing means for comparing at least two non-common portion costs associated with said non-common portions and for selecting a surviving one of said non-common portions with a minimum one of said non-common portion costs, whereby said selection of said surviving non-common portion based upon said minimum non-common portion cost determines which of said at least two members has said minimum member cost.

2. In the modulation-demodulation system according to claim 1, wherein said non-common portions of said at least two members define a set, said convolutional encoder means being designed so that said set is repeated in at least one other of said cosets and said branch cost calculator means further includes means for repeatedly using said minimum non-common portion cost determined from comparing said non-common portions of said set of one said coset in at least another said coset also having said set without having said comparing means repeat said comparison of said non-common portions of said set.

3. In the modulation-demodulation system according to claim 2, wherein each said component is a 2-dimensional symbol subset of 2-dimensional symbols, each said non-common portion includes at least two said non-common components, and further comprising slicer means for determining for at least a first said non-common component a pair of point costs for each said 2-dimensional symbol subset, one of said point costs of said pair comprising a quantity related to a Euclidean distance between a received signal and an inner 2-dimensional symbol of said 2-dimensional symbol subset that is closest in Euclidean distance to said received signal relative to a plurality of other inner 2-dimensional symbols of said 2-dimensional symbol subset and the other point cost of said pair comprising a quantity related to a Euclidean distance between said received signal and an outer 2-dimensional symbol of said 2-dimensional symbol subset that is closest in Euclidean distance to said received signal relative to a plurality of other outer 2-dimensional symbols of said 2-dimensional symbol subset, said comparing means selecting for each said pair of point costs the one that is a minimum, said selected point cost comprises said component cost for that particular said component.

4. In the modulation-demodulation system according to claim 3, wherein said comparing means further includes means for determining whether said first non-common component included one of said outer 2-dimensional symbols and means for defining a second said non-common component to have said component cost thereof to include that of one of said inner 2-dimensional symbols if said outer 2-dimensional symbol was previously found.

5. In the modulation-demodulation system according to claim 2, wherein each said component is a 2-dimensional symbol subset of 2-dimensional symbols and further comprising slicer means for determining said component costs for said 2-dimensional symbol subsets, each said component cost comprising a quantity related to a Euclidean distance between a received signal and one of said 2-dimensional symbols from one of said 2-dimensional symbol subsets that is closest in Euclidean distance to said received signal relative to the other said 2-dimensional symbols of said one of said 2-dimensional symbol subsets.

6. In the modulation-demodulation system according to claim 2, wherein each of said members is one of a plurality of multidimensional symbol subsets and each of said components thereof is one of a plurality of 2-dimensional symbol subsets and wherein in said transmitter a multidimensional symbol is selected from one of said multidimensional symbol subsets during each said group interval for transmission, each said multidimensional symbol including a plurality of said 2-dimensional symbols, said 2-dimensional symbols including inner 2-dimensional symbols and outer 2-dimensional symbols.

7. In the modulation-demodulation system according to claim 6, further comprising:
slicer means for determining said component costs for said 2-dimensional symbol subsets, said component costs being provided to said branch cost calculator means, each of said component costs of a particular one of said 2-dimensional symbol subsets being for a 2-dimensional symbol therefrom that is closest in Euclidean distance to a received signal regardless of whether said 2-dimensional symbol is one of said inner 2-dimensional symbols and regardless of whether said 2-dimensional symbol is one of said outer 2-dimensional symbols;
Viterbi decoder means for providing a best estimated one of said members during each said group interval;
said slicer means further providing for each said 2-dimensional symbol subset of said best estimated member one of said inner 2-dimensional symbols which is closest in Euclidean distance to said received signal relative to the other said inner 2-dimensional symbols of said 2-dimensional symbol subset and said component cost therefor and one of said outer 2-dimensional symbols which is closest in Euclidean distance to said received signal relative to the other said outer 2-dimensional symbols of said 2-dimensional symbol subset; and
said Viterbi decoder being operable for using said estimated member and said received signal to determine a best estimate of a multidimensional symbol, wherein said Viterbi decoder is operable for calculating for said estimated member said member cost for each of a plurality of permissible sequences of at least said inner 2-dimensional symbols and at least one of said outer 2-dimensional symbols.

8. In the modulation-demodulation system according to claim 1, wherein said comparing means includes means for categorizing said members of each said coset into a plurality of subcosets, each said subcoset having two pairs of said members, said convolutional encoder means being designed so that said at least one group comprises said pairs of members with each said member of each said pair having relative to the other said member of said pair said non-common portion with two said non-common components and said common portion with two said common components, one of said common components of both said pairs of the same said subcoset being in common between said pairs for the same baud and thereby defining four common-subcoset-components, whereby for each said subcoset said components are in common for all four said members in one of said bauds and two pairs of said components are in common within said pairs in another of said bauds.

9. In the modulation-demodulation system according to claim 8, wherein said non-common portion costs each comprises a two-component cost which is a sum of said component costs associated with said non-common components forming one of said non-common portions and said minimum non-common component cost comprises a minimum said two-component cost, and said non-common portions of each of said pairs of members define a set, and wherein said comparing means compares for each unique said set said two-component costs associated with said non-common portions of said sets and selects for each of said sets one of said non-common portions having said minimum two-component cost.

10. In the modulation-demodulation system according to claim 4, wherein said categorizing means groups said members so that there are four said subcosets in each said coset, four said cosets in each of four supercosets, a portion of each said member not including one of said common-subcoset-components is defined as a submember with three said components, said submembers of each said subcoset defining a submember-group; and wherein said convolutional encoder means is designed so that within each said coset said common-subcoset-components of each said subcoset are not in common with said common-subset-components of the other said subcosets, within each said supercoset each said coset has said subcosets thereof with the same said common-subset-components as those of said subcosets of the other said cosets, and each said submember-group of each said coset within one of said supercosets is repeated in each of the other said cosets in said one of said supercosets.

11. In the modulation-demodulation system according to claim 10, wherein there are eight unique said sets, said comparing means for comparing said non-common portions of said pair of said members selects from each of said sets so as to define eight said surviving non-common portions.

12. In the modulation-demodulation system according to claim 1, wherein said branch cost calculator means further comprises means for forming a plurality of three-component costs by adding one at a time to each said two-component cost of one of said surviving non-common portions each of four possible said component costs of one of said common components which is not one of said common-subcoset-components, whereby two of said three-component costs are defined for a pair of surviving said submembers of each said submember-group.

13. In the modulation-demodulation system according to claim 12, wherein said branch cost calculator means further comprises means for determining prior to said formation of said three component cost whether said two-component cost of each said non-common portion includes one of said component costs for an outer 2-dimensional symbol and means for defining said component cost for said common component which is not said common-subcoset-component to include one of said component costs of an inner 2-dimensional symbol if said component cost for sid outer 2-dimensional symbol is found.

14. In the modulation-demodulation system according to claim 12, wherein said comparing means compares said three-components costs of said pairs of said submembers of each said submember-group and selects one of said submembers for each said submember-group which has a minimum said three-component cost, whereby said minimum three-component cost is a cost for a single surviving said submember of said submember-group.

15. In the modulation-demodulation system according to claim 14, wherein said branch cost calculator means further includes means for repeatedly using said minimum three-component cost in one of said subcosets of each of said cosets within the same said supercoset.

16. In the modulation-demodulation system according to claim 15, wherein said branch cost calculator means further comprises means for adding to each said surving three-component cost one at a time each of four possible said component costs for said common-subcoset-components to form one of said member costs in each of said cosets within one of said supercosets and wherein said comparing means compares said member costs of said member of each said subcoset of each said coset and selects for each said coset said member having said minimum member cost.

17. In the modulation-demodulation system according to claim 16, wherein each said component is a 2-dimensional symbol subset of 2-dimensional symbols and further comprising slicer means for determining in each said baud a pair of point costs for each said 2-dimensional symbol subset, oné of said point costs of said pair being for one of a plurality of inner 2-dimensional symbols from said 2-dimensional symbol subset that is closest in Euclidean distance to a received signal relative to the other said inner 2-dimensional symbols of said 2-dimensional symbol subset and the other point costs of said pair being for one of a plurality of outer 2-dimensional symbols of said 2-dimensional symbol subset that is closest in Euclidean distance to said received signal relative to the other said outer 2-dimensional symbols of said 2-dimensional symbol subset, whereby there are eight said point costs for each said baud of which there are two for each possible said component.

18. In the modulation-demodulation system according to claim 17, wherein said comparing means for a first non-common component selects from said point costs of said pair the one that is a minimum to define said component cost for said first non-common component.

19. In the modulation-demodulation system according to claim 17, wherein said comparing means further includes selecting means for selecting said point cost of said pair that is a minimum to be said component cost for said non-common component considered first and defining means for specifying said component cost to be said point cost for one of said inner 2-dimensional symbols for every said component whose said component cost is compared by said comparing means after said minimum for said point cost of one of said outer 2-dimensional symbols is selected by said selecting means.

20. In the modulation-demodulation system according to claim 8, wherein said non-common components of each said pair of members define a set of said components, with there being eight unique said sets, said comparing means for comparing said non-common portions of said pair of said members being operable to repeat said comparison for each of said sets so as to define eight said surviving non-common portions.

21. A branch cost calculator for selecting a single member from each of a plurality of cosets of members based upon said single member having a member cost which is a minimum for each said coset; said members of each said coset being all of a plurality of multidimensional symbol subsets capable of being generated during a group interval by each transition of a convolutional encoder from a given present state to one of a plurality of permissible next states; said group interval consisting of a plurality of bauds; each said member having a plurality of components; each said component being associated with one of said bauds, each of said components comprising a 2-dimensional symbol subset and having a component cost associated therewith; said member cost being a sum of said component costs for said components of said member, wherein the improvement in the branch cost calculator comprises:

means for selecting at least two of said members from each of said cosets, each said selected member including a non-common portion and a common portion, said non-common portion including at least one non-common component which is different between said selected members of said coset and said common portion including at least one common component which is the same between said selected members of said coset; and means for comparing at least non-common portion costs associated with said non-common portions and for selecting a surviving said non-common portion with a minimum said non-common portion cost, whereby said selection of said surviving non-common portion based upon said minimum non-common portion cost determines which of said selected members has said minimum member cost.

22. In the branch cost calculator according to claim 21, further comprising means for repeatedly using said minimum non-common portion cost determined from comparing particular said non-common portions of one said coset in at least another said coset also having said particular non-common portions.

23. In the branch cost calculator according to claim 22, wherein said means for selecting includes means for arranging said members of each said coset into a plurality of subcosets, each said subcoset including two pairs of said members, each said member of each said pair having relative to the other said member of said pair said non-common portion with two non-common components and said common portion with two common components, said common components of said members of both said pairs of a given said subcoset being in common between said pairs for the same one of said bauds and thereby defining common-subcoset-components, whereby within a given said subcoset said components are in common for all four said members in one of said bauds and two pairs of said components are in common in another of said bauds.

24. In the branch cost calculator according to claim 23, wherein said non-common portion costs each comprises a two-component summed cost which is a sum of said component costs associated with said non-common components forming said non-common portion and said minimum non-common portion cost comprises a minimum two-component summed cost and wherein said means for comparing compares for each said subcoset said two-component summed costs associated with said non-common portions of said members of said pairs and selects for each of said pairs one of said non-common portions having said minimum two-component summed cost.

25. In the branch cost calculator of claim 24, wherein said means for arranging said members of each said coset into said plurality of subcosets defines four said subcosets in each said coset, four said cosets in each of four supercosets, said common-subcoset-components of each said subcoset are not in common with said common-subset-components of the other said subcosets, within each said supercoset each said coset having said subcosets thereof with the same said common-subset-components as those of said subcosets of the other said cosets, each part of each said member not including said common-subcoset-component is defined as a submember with three said components, said submembers of each said subcoset defining a submember-group, each said submember-group of each said coset within one of said supercosets is repeated in each of the other said cosets in said one of said supercosets.

26. In a modulation-demodulation method for transmitting a plurality of information bits over a band limited channel, said method including convolutionally encoding said plurality of information bits using a convolutional encoder so as to provide each group interval one of a plurality of members of a coset, said coset being one of a plurality of cosets with each of said cosets being associated with a unique permissible transition of said convolutional encoder from a given present state to one of a plurality of next states, each said group interval having a plurality of bauds, each of said members having a plurality of components with each of said components being associated with a unique one of said bauds, said method further including at a receiver using a branch cost calculator for selecting one of said members from each of said cosets for said group interval based upon said selected member having associated therewith a minimum member cost relative to a plurality of member costs of the other said members of said coset, each of said member costs being a sum of a plurality of component costs for said components of one of said members, the improvement comprising the steps of:

providing at said transmitter at least one group of at least two of said members of one of said cosets so that said members of said group each have a non-common portion and a common portion, each of said non-common portions including at least one non-common component which is different between said at least two members and each of said common portions including at least one common component which is the same between said at least two members;

comparing at said receiver at least two non-common portion costs associated with said non-common portions and for selecting a surviving said non-common portion with a minimum said non-common portion cost, whereby said selection of said surviving non-common portion based upon said minimum non-common portion cost determines which of said at least two members has said minimum member cost.

27. In the modulation-demodulation method according to claim 26, wherein said non-common portions of said at least two members define a set, said step of providing further includes said set being repeated in at least another one of said cosets and further comprising, after said step of selecting, a step of repeatedly using said minimum non-common portion cost determined from comparing said non-common portions of said set of one said coset in at least another said coset also having said set without having to repeat said comparison of said non-common portions of said set.

28. In the modulation-demodulation method according to claim 27, wherein each said component is a 2-dimensional symbol subset of 2-dimensional symbols, and wherein said step of providing further includes providing each said non-common portion to include at least two said non-common components, and further comprises, prior to said step of comparing, steps of determining for at least a first said non-common component a pair of point costs for each said 2-dimensional symbol subset, one of said point costs of said pair comprising a quantity related to a Euclidean distance between a received signal and an inner 2-dimensional symbol of said 2-dimensional symbol subset that is closest in Euclidean distance to said received signal relative to a plurality of other inner 2-dimensional symbols of said 2-dimensional symbol subset and the other point cost of said pair comprising a quantity related to a Euclidean distance between said received signal and an outer 2-dimensional symbol of said 2-dimensional symbol subset that is closest in Euclidean distance to said received signal relative to a plurality of other outer 2-dimensional symbols of said 2-dimensional symbol subset and selecting for each said pair of point costs the one that is a minimum, said selected point cost comprises said component cost for that particular said component.

29. In the modulation-demodulation method according to claim 28, further comprising, prior to said step of comparing, steps of determining whether for said first non-common component included one of said outer 2-dimensional symbols and defining a second said non-common component to have said component cost thereof to include that of one of said inner 2-dimensional symbols if said outer 2-dimensional symbol was previously found.

30. In the modulation-demodulation method according to claim 28, further comprising, after said step of comparing said non-common portions, the step of forming a plurality of three-component costs by adding one at a time to each said two-component cost of one of said surviving non-common portions each of four possible said component costs for said baud having said common components which are not common-subcoset-components, whereby two of said three-component costs are defined for a pair of surviving said submembers of each said submember-group.

31. In the modulation-demodulation method according to claim 30, further comprising, prior to said step of forming, a step of determining whether said two-component cost of each said non-common portion includes one of said component costs for an outer 2-dimensional symbol and means for defining said component cost for said common component which is not said common-subcoset-component to include one of said component costs of an inner 2-dimensional symbol if said component cost for said outer 2-dimensional symbol is found.

32. In the modulation-demodulation method according to claim 30, wherein said step of comparing further includes comparing said three-components costs of said pairs of said submembers of each said submember-group and selecting one of said submembers for each said submember-group which has a minimum said three-component cost, whereby said minimum three-component cost is a cost for a single surviving said submember of said submember-group.

33. In the modulation-demodulation method according to claim 32, further comprising, after said step of selecting one of said submembers, a step of repeatedly using said minimum three-component cost in one of said subcosets of each of said cosets within a same said supercoset.

34. In the modulation-demodulation method according to claim 27, wherein each said component is a 2-dimensional symbol subset of 2-dimensional symbols and, prior to said step of comparing, further comprising a step of determining said component costs for said 2-dimensional symbol subsets, each said component cost comprising a quantity related to a Euclidean distance between a received signal and one of said 2-dimensional symbols from one of said 2-dimensional symbol subsets that is closest in Euclidean distance to said received signal relative to the other said 2-dimensional symbols of said one of said 2-dimensional symbol subsets.

35. In the modulation-demodulation method according to claim 27, wherein each of said members is one of a plurality of multidimensional symbol subsets and each of said components thereof is one of a plurality of 2-dimensional symbol subsets and further comprising a step of selecting at said transmitter a multidimensional symbol from one of said multidimensional symbol subsets each said group interval for transmission, each said multidimensional symbol including a plurality of said 2-dimensional symbols, said 2-dimensional symbols including inner 2-dimensional symbols and outer 2-dimensional symbols.

36. In the modulation-demodulation method according to claim 35, further comprising the steps of:
   determining said component costs for said 2-dimensional symbol subsets, said component cost being provided to said branch cost calculations, each of said component costs of a particular one of said 2-dimensional symbol subsets being for a 2-dimensional symbol therefrom that is closest in Euclidean distance to a received signal regardless of whether said 2-dimensional symbol is one of said inner 2-dimensional symbols and regardless of whether said 2-dimensional symbol is one of said outer 2-dimensional symbols;
   providing using a Viterbi algorithm a best estimated one of said members each said group interval;
   further providing for each said 2-dimensional symbol subset of said best estimated member one of said inner 2-dimensional symbols which is closest in Euclidean distance to said received signal relative to the other said inner 2-dimensional symbols of said 2-dimensional symbol subset and said component cost therefor and one of said outer 2-dimensional symbols which is closest in Euclidean distance to said received signal relative to the other said outer 2-dimensional symbols of said 2-dimensional symbol subset and said component cost therefor; and
   using said estimated member and said received signal to determine a best estimate of a multidimensional symbol, calculating for said estimated member said member cost for each of a plurality of permissible sequences of at least inner 2-dimensional symbols and at least one outer 2-dimensional symbols.

37. In the modulation-demodulation method according to claim 26, wherein said step of comparing includes categorizing said members of each said coset into a plurality of subcosets, each said subcoset having two pairs of said members to define a plurality of said pairs of members, said step of providing further includes providing said at least one group of said members to be said plurality of pairs of members with each said member of each said pair having relative to the other said member of said pair said non-common portion with two said non-common components and said common portion with two said common components, one of said common components of said members of both said pairs of the same said subcoset being in common between said pairs for the same baud and thereby defining four common-subcoset-components, whereby for each said subcoset said components are in common for all four said members in one of said bauds and two pairs of said components are in common within said pairs in another of said bauds.

38. In the modulation-demodulation method according to claim 37, wherein said non-common portion costs each comprises a two-component cost which is a sum of said component costs associated with said non-common components forming one of said non-common portions and said minimum non-common component cost comprises a minimum said two-component cost, and said non-common portions of said pairs of members define a set, and wherein said step of comparing includes comparing for each unique said set said two-component costs associated with said non-common portions of said sets and selecting for each of said sets one of said non-common portions having said minimum two-component cost.

39. In the modulation-demodulation method according to claim 38, wherein said step of categorizing includes grouping said members so that there are four said subcosets in each said coset, four said cosets in each of four supercosets, a portion of each said member not including said common-subcoset-component is defined as a submember with three said components, and said submembers of each said subcoset defining a submember-group; and wherein said step of providing said members further includes that within each said coset said common-subcoset-components of each said subcoset are not in common with said common-subset-components of the other said subcosets, within each said supercoset each said coset has said subcosets thereof with the same said common-subset-components as those of said subcosets of the other said cosets, and each said submember-group of each said coset within one of said supercosets is repeated in each of the other said cosets in said one of said supercosets.

40. In the modulation-demodulation method according to claim 39, wherein there are eight unique said sets, said step of comparing said non-common portions of said pair of said members includes the step of selecting from each of said sets so as to define eight said surviving non-common portions.

41. In the modulation-demodulation method according to claim 40, further comprising, after said step of repeatedly using said minimum three-component cost, steps of adding to each said surviving three-component cost one at a time each of four possible said component cost for said common-subcoset-components to form one of said member costs in each of said cosets within one of said supercosets and wherein said step of comparing includes comparing said member costs of said member of each said subcoset of each said coset and selecting for each said coset said member having said minimum member cost.

42. In the modulation-demodulation method according to claim 41, wherein each said component is a 2-dimensional symbol subset and further comprising a step of determining in each said baud a pair of point costs for each said 2-dimensional symbol subset, one of said point costs of said pair being for one of a plurality of inner 2-dimensional symbols from said 2-dimensional symbol subset that is closest in Euclidean distance to a received signal relative to the other said inner 2-dimensional symbols of said 2-dimensional symbol subset and the other of said point costs of said pair being for one of a plurality of outer 2-dimensional symbols of said 2-dimensional symbol subset that is closest in Euclidean distance to said received signal relative to the other said outer 2-dimensional symbols of said 2-dimensional symbol subset, whereby there are eight said point costs for each said baud of which there are two for each possible said component.

43. In the modulation-demodulation method according to claim 42, wherein said step of comparing a first non-common component further includes selecting from said point costs of said pair the one that is a minimum to define said component cost for said first non-common component.

44. In the modulation-demodulation method according to claim 42, wherein said step of comparing further includes selecting point cost of said pair that is a minimum to be said component cost for said non-common component of one of said members considered first of one of said members and specifying said component cost to be said point cost for one of said inner 2-dimensional symbols for every said component of said member whose said component cost is compared after said point cost of one of said outer 2-dimensional symbols is selected.

45. In the modulation-demodulation method according to claim 37, wherein said non-common components of each said pair of members define a set of said components, with said step of providing said members including providing eight unique said sets, said step of comparing includes comparing said non-common portions of said pair of said member for each of said sets so as to define eight said surviving non-common portions.

46. In a receiver of a modulation-demodulation apparatus including a branch cost calculator means for use in combination with a Viterbi decoder means, said Viterbi decoder means operable to determine a minimum cost path from a plurality of surviving paths though a trellis, said trellis having a plurality of states repeated for each one of a plurality of group intervals, each one of said group intervals including a plurality of baud periods, said trellis during a present group interval having a plurality of cosets of parallel branches extending from each current state associated with a present one of said group intervals to one of a plurality of next states associated with a next one of said group intervals, said branch cost calculator means being operable for selecting from each of said cosets of parallel branches one of said parallel branches which thereafter becomes a candidate branch to form part of one of said plurality of surviving paths, each of said parallel branches of said coset being associated with a unique multidimensional-symbol-subset of multidimensional symbols, each of said multidimensional-symbol-subsets includes a plurality of 2-dimensional symbol subsets of 2-dimensional symbols, each of said 2-dimensional symbol subsets being associated with a unique one of said plurality of baud periods, said Viterbi decoder means being operable for providing a best estimated multidimensional-symbol-subset for each one of said group intervals and for selecting a best estimated multidimensional symbol from said best estimated multidimensional-symbol-subset based upon a received multidimensional signal, wherein the improvement in the receiver comprises:

said Viterbi decoder means being operable for selecting a plurality of said multidimensional symbols from said best estimated multidimensional-symbol-subset, each of said selected multidimensional symbols having a unique one of a plurality permissible sequences of inner 2-dimensional symbols and outer 2-dimensional symbols, each of said inner 2-dimensional symbols and said outer 2-dimensional symbol being selected from their respective said 2-dimensional symbol subsets based upon having a minimum 2-dimensional symbol cost;

said Viterbi decoder means being operable for summing said minimum 2-dimensional symbol costs for each of said selected multidimensional symbols to define a multidimensional symbol cost for each of said selected multidimensional symbols and for selecting said selected multidimensional symbol with a minimum said multidimensional symbol cost to be said best estimated multidimensional symbol.

47. In the receiver according to claim 46, further comprising:

slicer means for determining said 2-dimensional symbol costs for said 2-dimensional symbol subsets, said 2-dimensional symbol cost being provided to said branch cost calculator, each of said 2-dimensional symbol costs of a particular one of said 2-dimensional symbol subsets being for a 2-dimensional symbol of said particular 2-dimensional symbol subset that is closest in Euclidean distance to said received signal regardless of whether said 2-dimensional symbol is one of said inner 2-dimensional symbols and regardless of whether said 2-dimensional symbol is one of said outer 2-dimensional symbols;

said slicer means further providing to said Viterbi decoder for each said 2-dimensional subset of said best estimated multidimensional-symbol-subset one of said inner 2-dimensional symbols from said 2-dimensional symbol subset and said 2-dimensional cost therefor and one of said outer 2-dimensional symbols from said 2-dimensional symbol subset and said 2-dimensional symbol cost therefor, both of said inner and outer 2-dimensional symbols being closest in Euclidean distances to said received multidimensional signal relative to other said inner and outer 2-dimensional symbols of said 2-dimensional symbol subset, respectively.

48. In the receiver according to claim 47, wherein said branch cost calculator means further comprises:

means for selecting for each one of said cosets at least two of said multidimensional-symbol-subsets associated with said parallel branches of the same one of said cosets wherein said plurality of 2-dimensional symbol subset of said selected multidimensional-symbol-subsets of said same coset include non-common 2-dimensional symbol subsets for at least one of said baud periods which are different between said selected multidimensional-symbol-subsets and thereby define a non-common portion of each said multidimensional-symbol-subsets and further including common 2-dimensional symbol subsets for at least one of said baud periods which are the same between said selected multidimensional-symbol-subsets and thereby define a common portion of each of said multidimensional-symbol-subsets; and means for comparing a summed cost of said 2-dimensional symbol costs associated with said non-common portions and for selecting a surviving one of said non-common portions with a smallest said summed cost, whereby said selection of said surviving non-common portion with said smallest summed cost determines which of said selected multidimenional-symbol-subset of said same coset has a smallest summed cost of said 2-dimensional costs of said selected multidimensional-symbol-subset.

49. In the receiver according to claim 48, further including means for locating said compared non-common portions in a plurality of cosets and means for using the said smallest summed cost of said surviving said non-common portion in at least one other of said cosets so that said comparison of said summed costs of said non-common portions is not made in said at least one other coset.

50. In the receiver according to claim 49, wherein each of said non-common portions comprises two said non-common components and each of said common portions comprises two said common components.

51. In the receiver according to claim 50, wherein said means for selecting for each one of said cosets at least two of said multidimensional-symbol-subsets includes means for categorizing all of said multidimensional-symbol-subsets within said coset into exclusive pairs of said selected multidimensional-symbol-subsets.

52. In the receiver according to claim 46, wherein one of said selected multidimensional symbols has only said inner 2-dimensional symbols and the other said selected multidimensional-symbol-subsets have only one of said outer 2-dimensional symbols with each of said other multidimensional symbols having said one outer 2-dimensional symbol in a different baud period.

53. In a Viterbi decoder for providing each group interval a best estimated multidimensional-symbol-subset of a plurality of multidimensional symbols and for selecting a best estimated multidimensional symbol from said best estimated multidimensional-symbol-subset based upon a received multidimensional signal, said best estimated multidmensional-symbol-subset including a plurality of 2-dimensional symbol subsets, said best estimated multidimensional symbol including a plurality of 2-dimensional symbols selected from said 2-dimensional symbol subsets, wherein the improvement in the Viterbi decoder comprises;

means for selecting a plurality of said multidimensional symbols from said best estimated multidimensional-symbol subset having all permissible sequences of a plurality of inner and outer 2-dimensional symbols, each of said inner and outer 2-dimensional symbols being selected from their said 2-dimensional symbol subsets based upon having a minimum 2-dimensional symbol cost; and means for determining a quantity substantially equal to a sum of said minimum 2-dimensional symbol costs for each said permissible sequence to define a multidimensional symbol cost for each said permissible sequence and for selecting said sequence with a minimum said multidimensional symbol cost to be said best estimated multidimensional symbol.

* * * * *